United States Patent
Kato et al.

(10) Patent No.: US 9,824,766 B2
(45) Date of Patent: Nov. 21, 2017

(54) SEMICONDUCTOR DEVICE INCLUDING NONVOLATILE MEMORY CONFIGURED TO SWITCH BETWEEN A REFERENCE CURRENT READING SYSTEM AND A COMPLEMENTARY READING SYSTEM

(71) Applicant: RENESAS ELECTRONICS CORPORATION, Tokyo (JP)

(72) Inventors: Tamiyu Kato, Tokyo (JP); Takanobu Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/843,848

(22) Filed: Sep. 2, 2015

(65) Prior Publication Data
US 2016/0064095 A1    Mar. 3, 2016

(30) Foreign Application Priority Data

Sep. 3, 2014 (JP) ................................ 2014-179180

(51) Int. Cl.
| | | |
|---|---|---|
| G11C 16/10 | (2006.01) | |
| G11C 16/28 | (2006.01) | |
| G11C 7/06 | (2006.01) | |
| G11C 7/18 | (2006.01) | |

(52) U.S. Cl.
CPC .............. *G11C 16/28* (2013.01); *G11C 7/062* (2013.01); *G11C 7/18* (2013.01); *G11C 16/10* (2013.01); *G11C 2207/005* (2013.01); *G11C 2207/063* (2013.01)

(58) Field of Classification Search
CPC ................................ G11C 16/28; G11C 7/062
See application file for complete search history.

(56) References Cited

U.S. PATENT DOCUMENTS

| | | | |
|---|---|---|---|
| 7,190,615 B2 | 3/2007 | Fujito et al. | |
| 7,646,642 B2 | 1/2010 | Fujito et al. | |
| 2009/0161417 A1* | 6/2009 | Fackenthal | G11C 8/10 365/163 |

(Continued)

FOREIGN PATENT DOCUMENTS

| | | |
|---|---|---|
| JP | 2004-318941 A | 11/2004 |
| JP | 2008-117510 A | 5/2008 |

OTHER PUBLICATIONS

Melissa Hunter et al., "Using the Kinetis Family Enhanced EEPROM Functionality", Freescale Semiconductor Application Note, Document No. AN4282, Rev.0, Mar. 2011, 18 pages.

*Primary Examiner* — Douglas King
(74) *Attorney, Agent, or Firm* — McDermott Will & Emery LLP

(57) ABSTRACT

The present invention provides a semiconductor device including a nonvolatile memory of which the memory size of a data area and the memory size of a code area can be freely changed. The semiconductor device according to one embodiment includes a nonvolatile memory which can switch between a reference current reading system which performs data read by comparing a current flowing through a first memory cell as a read target and the reference current and a complementary reading system which performs data read by comparing currents flowing through a first memory cell and a second memory cell storing complementary data, as a read target.

6 Claims, 24 Drawing Sheets

(56) References Cited

U.S. PATENT DOCUMENTS

2013/0235678 A1* 9/2013 McCollum .............. G11C 7/02
  365/189.09
2016/0172027 A1* 6/2016 Tahmasebian ..... G11C 13/0016
  257/40

* cited by examiner

FIG. 1
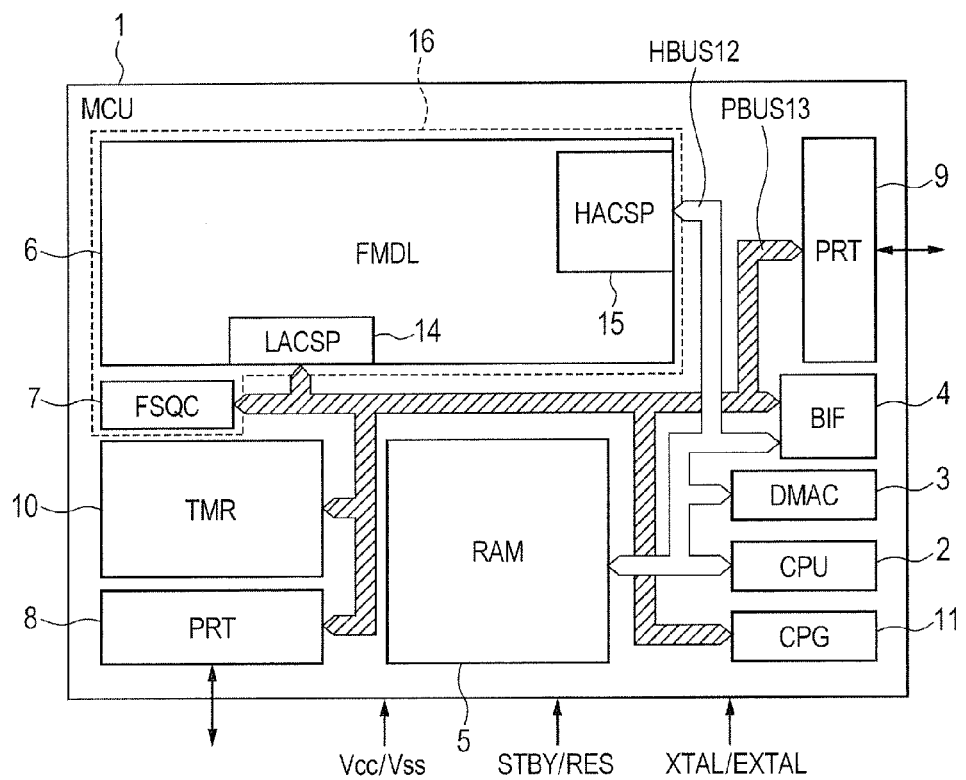
FIG. 2A
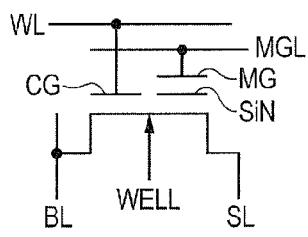
FIG. 2B
| | BL | CG | MG | SL | WELL | |
|---|---|---|---|---|---|---|
| READ | 1.5V | 1.5V | 0V | 0V | 0V | |
| INCREASE Vth | 0V | 1.5V | 10V | 6V | 0V | (PER BIT) |
| DECREASE Vth | Hi-Z | 0V | -10V | 6V | 0V | (ALL TOGETHER) |

|  | BL | WL | SL | WELL |  |
|---|---|---|---|---|---|
| READ | 1.5V | 1.5V | 0V | 0V |  |
| INCREASE Vth | 6V | 10V | 0V | 0V | (PER BIT) |
| DECREASE Vth | 10V | -10V | 10V | 10V | (ALL TOGETHER) |

|  | BL | WL | SL | WELL |  |
|---|---|---|---|---|---|
| READ | 1.5V | 1.5V | 0V | 0V |  |
| INCREASE Vth | -10V | 10V | -10V | -10V | (ALL TOGETHER) |
| DECREASE Vth | 10V | -10V | 0V | 0V | (PER BIT) |

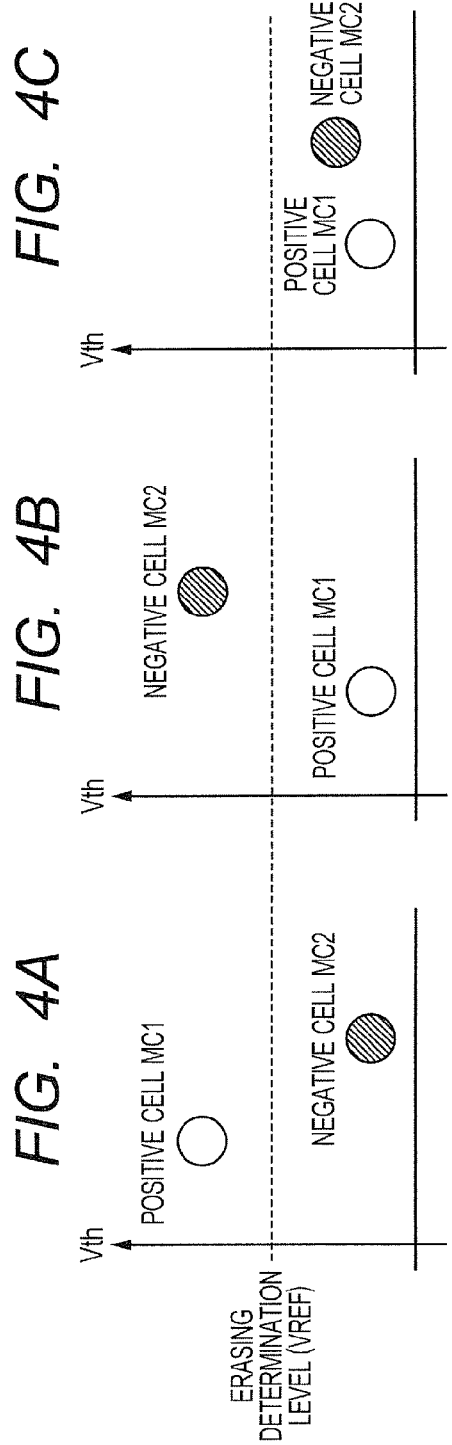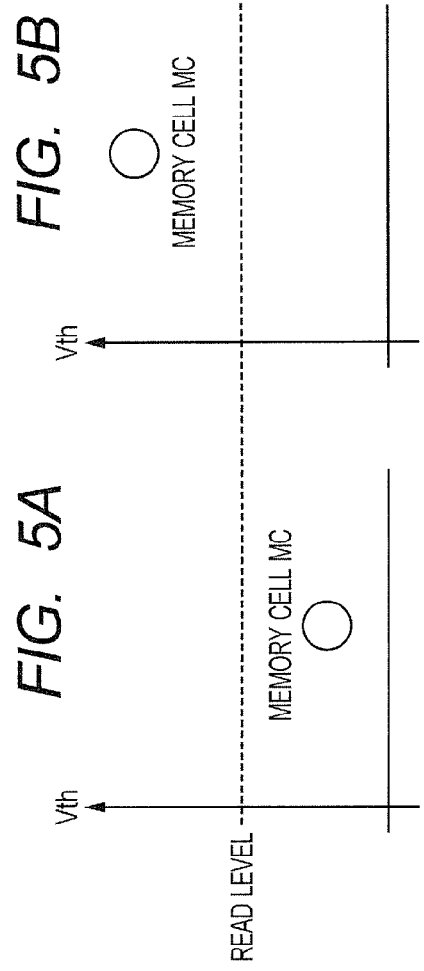

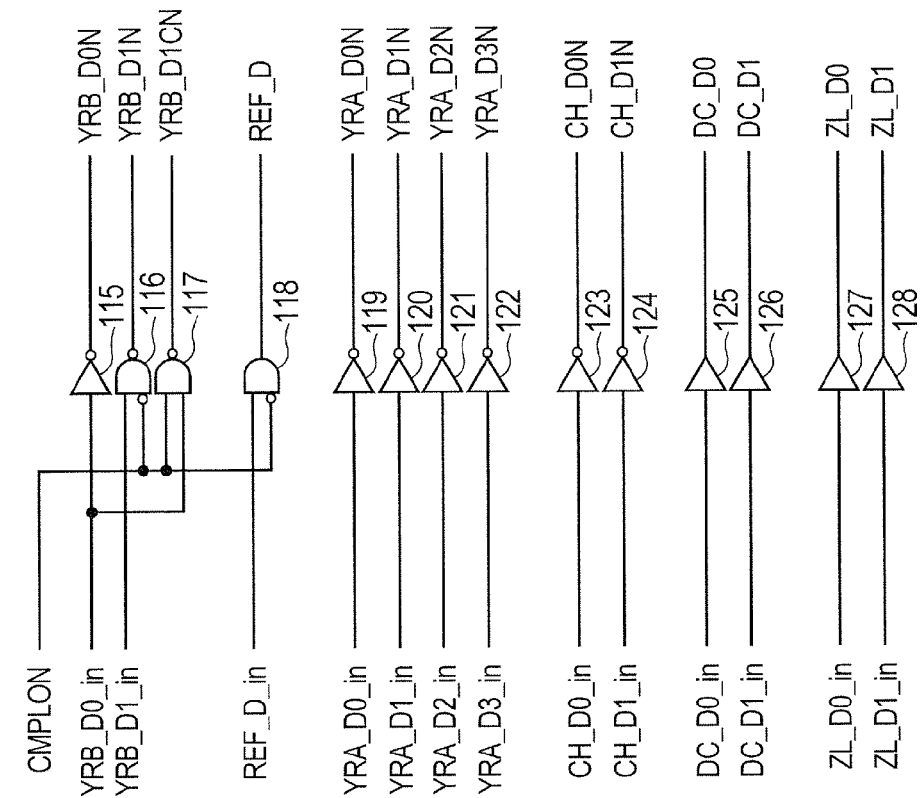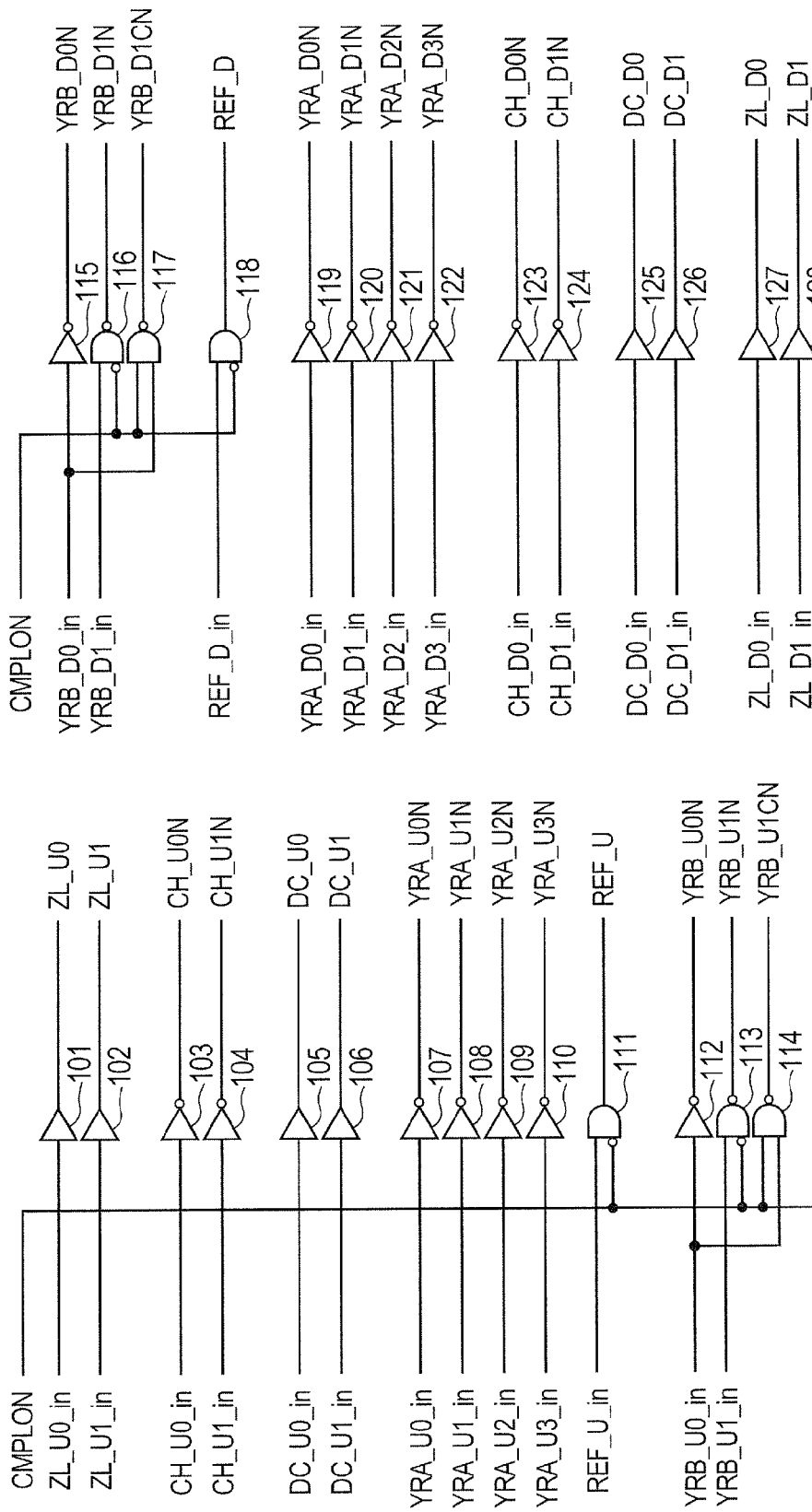

US 9,824,766 B2

SEMICONDUCTOR DEVICE INCLUDING NONVOLATILE MEMORY CONFIGURED TO SWITCH BETWEEN A REFERENCE CURRENT READING SYSTEM AND A COMPLEMENTARY READING SYSTEM

CROSS-REFERENCE TO RELATED APPLICATIONS

The disclosure of Japanese Patent Application No. 2014-179180 filed on Sep. 3, 2014 including the specification, drawings and abstract is incorporated herein by reference in its entirety.

BACKGROUND

The present invention relates to a semiconductor device, and is used suitably for a semiconductor device such as a microcomputer which includes a nonvolatile memory.

As a storing system of a nonvolatile memory, there are a system in which data of "1" or "0" is stored in each memory cell (for example, refer to Japanese Unexamined Patent Application Publication No. 2004-318941 (Patent Document 1)) and a system in which complementary data of "1" and "0" are stored in a pair of memory cells (for example, refer to Japanese Unexamined Patent Application Publication No. 2008-117510 (Patent Document 2)). In the former system, data of a memory cell is read by comparing a current which flows through the memory cell with a reference current (hereinafter called a reference current reading system). In the latter system, data of a memory cell pair is read by comparing currents which flow through the memory cells configuring the pair (hereinafter called a complementary reading system).

Compared with the complementary reading system, the reference current reading system has a fast read speed and is capable of increasing the storage capacity (capable of decreasing the memory size). However, the reference current reading system has a demerit that the rewritable count is small compared with the complementary reading system, since it is necessary to fully erase the memory cell. Therefore, the reference current reading system is used in the code area where rewrite does not take place frequently.

On the other hand, compared with the reference current reading system, the complementary reading system has a small storage capacity (a large memory size); however the complementary reading system is capable of reducing the read current and increasing the rewritable count. Therefore, the complementary reading system is used in the data area where rewrite takes place frequently.

Freescale Semiconductor, Inc. provides a processor which mounts an on-chip flash memory with the function of EEE (Enhanced EEPROM) (refer to Non-patent Document 1). The flash memory with the EEE function concerned can select the case where priority is given to the reduction of memory size, and the case where priority is given to the retention (holding capability). However, its concrete hardware configuration is unknown.

PATENT DOCUMENT (Patent Document 1) Japanese Unexamined Patent Application Publication No. 2004-318941
(Patent Document 2) Japanese Unexamined Patent Application Publication No. 2008-117510

NON-PATENT DOCUMENT (Non-patent Document 1) Melissa Hunter and Derrick Klotz; "Using the Kinetis Family Enhanced EEPROM Functionality", Freescale Semiconductor Application Note, Document Number: AN4282, Rev. 0, March 2011

SUMMARY

As described above, in the case of a nonvolatile memory in the related art, the reference current reading system is employed in the code area, and the complementary reading system is employed in the data area. In this case, which of the reference current reading system and the complementary reading system is employed is decided by hardware. Therefore, there is an inconvenient issue in which a user is unable to freely change the memory size of the data area and the memory size of the code area, depending on an application.

The other issues and new features of the present invention will become clear from the description of the present specification and the accompanying drawings.

A semiconductor device according to one embodiment of the present invention includes a nonvolatile memory which can switch between a reference current reading system and a complementary reading system.

According to the one embodiment described above, it is possible to freely change the memory size of a data area and the memory size of a code area, in the nonvolatile memory.

BRIEF DESCRIPTION OF THE DRAWINGS

FIG. 1 is a block diagram illustrating the configuration of a semiconductor device according to Embodiment 1;
FIGS. 2A and 2B are explanatory drawings illustrating the configuration and operation of a memory cell (in the case of a split-gate flash memory element);
FIG. 4A-4C are explanatory drawings illustrating the cell data in the complementary reading system;
FIGS. 5A and 5B are explanatory drawings illustrating the cell data in the reference current reading system;
FIGS. 9A and 9B are drawings illustrating the configuration of a driver circuit for driving each control signal line in the hierarchy sense amplifier band illustrated in FIG. 7.

DETAILED DESCRIPTION

Figures 3A, 3B, 3C:
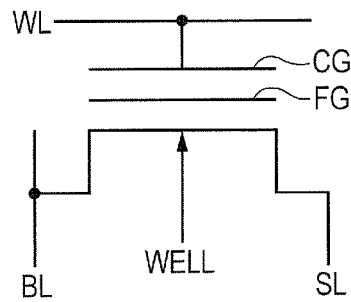
FIGS. 3A-3C are explanatory drawings illustrating the configuration and operation of a memory cell (in the case of a stacked-gate flash memory cell)

Hereinafter, each embodiment is described in detail with reference to accompanying drawings. The following explains a flash memory as an example of the nonvolatile memory device. However, the nonvolatile memory device is not restricted to a flash memory in particular, as long as it is an electrically erasable-and-programmable nonvolatile memory, such as an EEPROM (Electrically Erasable Programmable Read-Only Memory). In the following explanation, the same symbol or reference numeral is attached to the same or corresponding element and the repeated explanation thereof will be omitted.

<Embodiment 1>

(A Microcomputer)

FIG. 1 is a block diagram illustrating the configuration of a semiconductor device according to Embodiment 1. FIG. 1 illustrates the configuration of a microcomputer (MCU) 1 as an example of the semiconductor device.

With reference to FIG. 1, the microcomputer 1 is formed in one semiconductor chip such as single crystal silicon by employing integrated circuit manufacturing technology for a CMOS (Complementary Metal Oxide Semiconductor), for example.

The microcomputer 1 includes a central processing unit (CPU) 2, a random access memory (RAM) 5, and a flash memory module (FMDL) 6, as illustrated in FIG. 1. The central processing unit 2 includes an instruction controlling part and an execution part, and executes an instruction. The random access memory 5 is used for a work space of the central processing unit 2. The flash memory module 6 is provided as a nonvolatile memory module to store data and a program.

The microcomputer 1 further includes a direct memory access controller (DMAC) 3, a bus interface circuit (BIF) 4, a flash sequencer (FSQC) 7, external I/O ports (PRT) 8 and 9, a timer (TMR) 10, a clock pulse generator (CPG) 11, a high speed bus (HBUS) 12, and a peripheral bus (PBUS) 13.

The bus interface circuit 4 performs bus interface control or bus bridge control between the high speed bus 12 and the peripheral bus 13. The flash sequencer 7 performs command access control to the flash memory module (FMDL) 6. The clock pulse generator 11 generates an internal clock CLK for controlling the microcomputer 1.

Although not limited in particular, the bus architecture of the microcomputer 1 in the case of FIG. 1 has the high speed bus (HBUS) 12 and the peripheral bus (PBUS) 13. Although not limited in particular, each of the high speed bus 12 and the peripheral bus 13 has a data bus, an address bus, and a control bus. By providing two buses of the high speed bus 12 and the peripheral bus 13, it is possible to mitigate the load of the bus and to guarantee a high-speed access operation, compared with the case where all the circuits are coupled to a common bus.

To the high speed bus 12, the central processing unit 2, the direct memory access controller 3, the bus interface circuit 4, the random access memory 5, and the flash memory module 6 are coupled. To the peripheral bus 13, the flash sequencer 7, the external I/O ports 8 and 9, the timer 10, and the clock pulse generator 11 are coupled.

The microcomputer 1 further includes a clock terminal XTAL/EXTAL to which an oscillator is coupled or an external clock is supplied, an external hardware standby terminal STB for indicating a standby state, an external reset terminal RES for indicating a reset, an external power terminal Vcc, and an external ground terminal Vss.

In FIG. 1, the flash sequencer 7 as a logic circuit and the flash memory module 6 formed in an array are designed using different CAD tools. Accordingly, they are shown as separate circuit blocks for convenience. However, they configure a flash memory 16 in combination.

The flash memory module 6 is coupled to the high speed bus (HBUS) 12 via the read-only high-speed access port (HACSP) 15. The CPU 2 or the DMAC 3 can read-access the flash memory module 6 via the high-speed access port 15 from the high speed bus 12. When the CPU 2 or the DMAC 3 write-accesses and initializes the flash memory module 6, they issue a command to the flash sequencer 7 via the peripheral bus (PBUS) 13 through the intermediary of the bus interface 4. Responding to this command, the flash sequencer 7 performs control of the initialization and the write operation to the flash memory module, via a low-speed access port (LACSP) from the peripheral bus PBUS.

(Configuration and Operation of a Memory Cell)

FIGS. 2A and 2B and FIGS. 3A-3C are explanatory drawings illustrating the configuration and operation of a memory cell. FIGS. 2A and 2B illustrate the case of a split-gate flash memory element, and FIGS. 3A-3C illustrate the case of a stacked-gate flash memory cell.

With reference to FIG. 2A, the split-gate flash memory element includes a control gate CG and a memory gate MG which are arranged over a channel forming region between a source region and a drain region via a gate insulating film. A charge trapping region such as silicon nitride (SiN) is arranged between the memory gate MG and the gate insulating film. The control gate CG is coupled to a word line WL, and the memory gate MG is coupled to a memory gate selection line MGL. A drain region (or source region) on the side of the control gate CG is coupled to a bit line BL, and a source region (or drain region) on the side of the memory gate MG is coupled to a source line SL.

FIG. 2B illustrates an example of the voltage setup at the bit line BL, the control gate CG, the memory gate MG, the source line SL, and a well region (WELL), at the time of read and write/erase of the split-gate flash memory element.

Specifically, in order to decrease a threshold voltage Vth of the memory cell, it is set such as BL=1.5V, CG=0.0V, MG=−10V, SL=6V, and WELL=0V, for example. Accordingly, among electrons and holes which are generated by a high electric field between the well region (WELL) and the memory gate MG, holes are injected into the charge trapping region (SiN) from the well region (WELL). This processing is performed in units of plural memory cells which share the memory gate.

In order to increase the threshold voltage Vth of the memory cell, it is set such as BL=0V, CG=1.5V, MG=10V, SL=6, and WELL=0V, for example. In this case, when a write current flows into the bit line from the source line SL, hot electrons are generated in the boundary portion of the control gate and the memory gate, and the generated hot electrons are injected into the charge trapping region (SiN). The electron injection is decided depending on whether the bit-line current is flowed or not. Therefore, this processing is controlled in units of bits.

At the time of read, it is set such as BL=1.5V, CG=1.5V, MG=0V, SL=0V, and WELL=0V, for example. When the threshold voltage Vth of the memory cell is low, the resistance of the memory cell becomes small (ON state), and when the threshold voltage Vth is high, the resistance of the memory cell becomes large (OFF state).

The stacked-gate flash memory element illustrated in FIG. 3A is formed by stacking a floating gate FG and a control gate CG over a channel forming region between a source region and a drain region via a gate insulating film. The control gate CG is coupled to a word line WL. The drain region is coupled to a bit line BL, and the source region is coupled to a source line SL.

FIGS. 3B and 3C illustrate an example of the voltage setup of the bit line BL, the word line WL, the source line SL, and the well region (WELL), at the time of read and write/erase of the stacked-gate flash memory element. FIG. 3 (B) illustrates an example of the voltage setup in the case of increasing the threshold voltage Vth by a hot carrier writing system, and decreasing the threshold voltage Vth by the discharge of electrons to the well region WELL. FIG. 3C illustrates an example of the voltage setup in the case of increasing the threshold voltage Vth by an FN tunnel writing system, and decreasing the threshold voltage Vth by the discharge of electrons to the bit line BL.

In the present specification, the control gate CG is also called a control electrode, the impurity region coupled to the bit line BL is also called a first main electrode, and the impurity region coupled to the source line SL is also called a second main electrode.

(On the Reference Current Reading System and the Complementary Reading System)

FIG. 4A-4C are explanatory-drawings illustrating the cell data in the complementary reading system. FIGS. 5A and 5B are explanatory drawings illustrating the cell data in the reference current reading system.

As the information storage system in the flash memory module, there are a complementary reading system in which the storage of one bit of information is realized by use of two nonvolatile memory cells, and a reference current reading system in which the storage of one bit of information is realized by use of one nonvolatile memory cell.

With reference to FIG. 4A-FIG. 4C, in the complementary reading system, two rewritable nonvolatile memory cells MC1 and MC2 specified in advance in a memory array are used as a twin cell expressing one bit. In the present specification, the memory cell MC1 is called a positive cell and the memory cell MC2 is called a negative cell. Each of the memory cells MC1 and MC2 can hold a cell data "1" (a low threshold voltage state; a state where the threshold voltage is smaller than an erase verifying level), or a cell data "0" (a high threshold voltage state; a state where the threshold voltage is equal to or greater than the erase verifying level).

The information storage by a twin cell is realized by storing complementary data in the nonvolatile memory cells MC1 and MC2 as a twin cell. That is, as illustrated in FIG. 4A, a twin cell data "0" corresponds to the state where the positive cell MC1 holds a cell data "0" and the negative cell MC2 holds a cell data "1." As illustrated in FIG. 4B, a twin cell data "1" corresponds to the state where the positive cell MC1 holds a cell data "1" and the negative cell MC2 holds a cell data "0." As illustrated in FIG. 4C, the state where both of the positive cell MC1 and the negative cell MC2 of the twin cell hold a cell data "1" corresponds to an initialization state, and the twin cell data is indefinite.

With reference to FIG. 5A and FIG. 5B, in the reference current reading system, one bit of data is stored in each rewritable nonvolatile memory cell MC in a memory array. Accordingly, in the reference current reading system, there is no distinction between a positive cell and a negative cell. As illustrated in FIG. 5A, a cell data "1" corresponds to the state where the memory cell MC holds a cell data "1" (a low threshold voltage state). As illustrated in FIG. 5B, a cell data "0" corresponds to the state where the memory cell MC holds a cell data "0" (a high threshold voltage state).

(Flash Memory Module)

Figure 6:
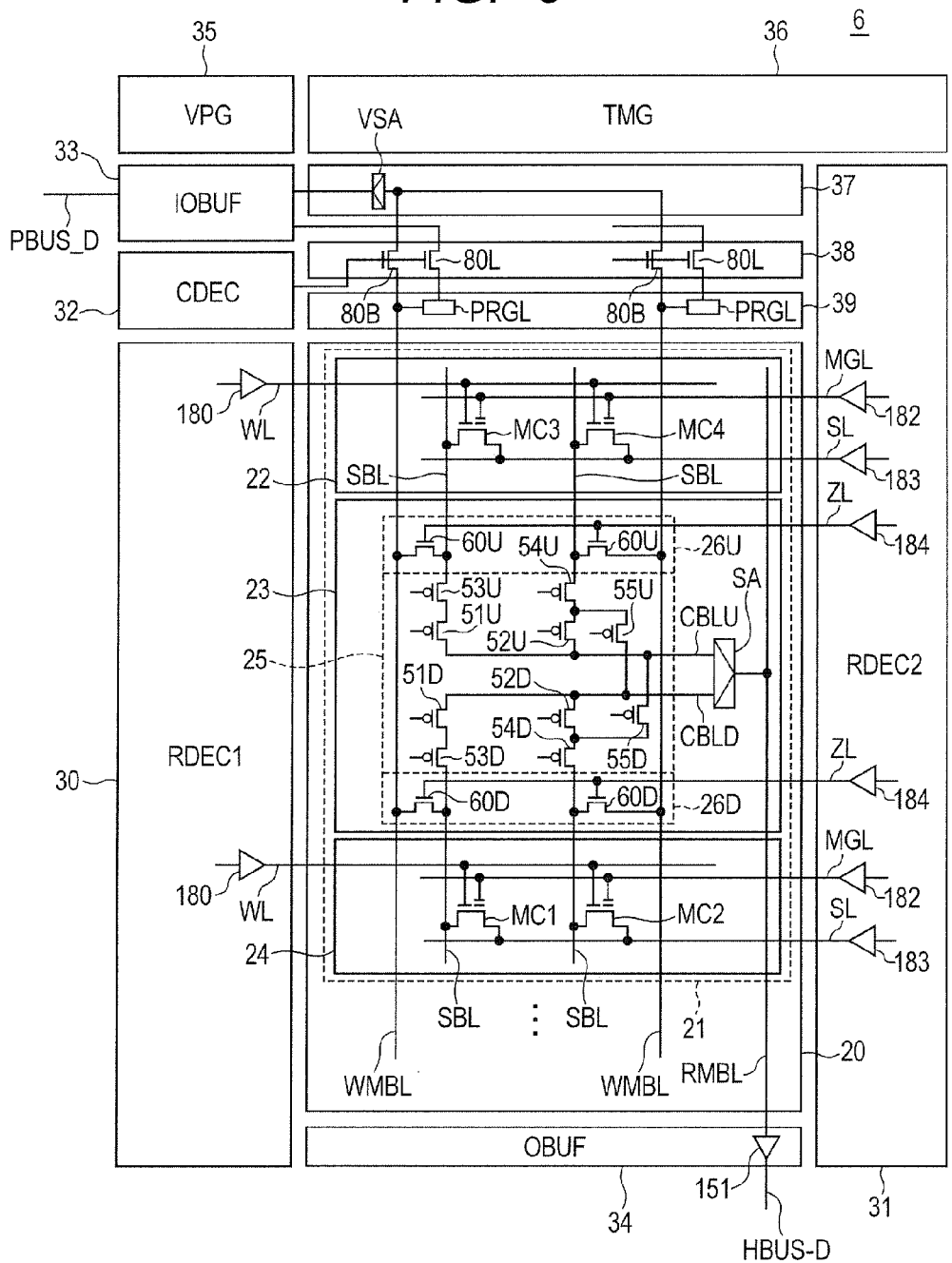
FIG. 6 is a block diagram illustrating the configuration of a flash memory module illustrated in FIG. 1.

FIG. 6 is a block diagram illustrating the configuration of the flash memory module illustrated in FIG. 1. In FIG. 6, the up and down direction of the page space is called a column direction, and the left and right direction of the page space is called a row direction. With reference to FIG. 6, the flash memory module 6 includes a memory mat 20, an output buffer (OBUF) 34, a first row decoder (RDEC1) 30, and a second row decoder (RDEC2) 31.

The memory mat 20 includes a hierarchy sense amplifier band 23 and memory arrays 22 and 24 provided on both sides of the hierarchy sense amplifier band in the column direction, as one constituent unit (hereinafter called a memory block 21). Plural pieces of such a memory block 21 are arranged in the column direction in the memory mat 20 (FIG. 6 illustrates only one piece of the memory block 21 typically). In the following, the memory array 22 is also called an upside memory array 22, and the memory array 24 is also called a downside memory array 24.

The memory mat 20 includes plural word lines WL extending in the row direction, plural memory gate selection lines MGL extending in the row direction, plural source lines SL extending in the row direction, and plural sub bit lines SBL extending in the column direction. These control signal lines are provided for each of the memory arrays 22 and 24.

The memory mat 20 includes plural write-system main bit lines WMBL and a read-system main bit line RWBL which are provided in common in the memory mat 20. Each of the write-system main bit lines WMBL corresponds to the plural sub bit lines SBL, and is coupled to the corresponding sub bit line SBL via sub-bit-line selectors 26U and 26D. That is, the write-system main bit line WMBL and the sub bit line SBL are hierarchized.

Plural memory cells MC arranged in a matrix are disposed in the memory arrays 22 and 24. Each row of the memory array corresponds to each of the word lines WL, and corresponds to each of the memory gate selection lines MGL. That is, the word line WL and the memory gate selection line MGL are provided in units of rows of the memory array. Each column of the memory array corresponds to each of the sub bit lines SBL. That is, the sub bit line SBL is provided in units of columns of the memory array. The source line SL is coupled in common to plural rows of the memory array. At the time of data read, the source line SL is coupled to the ground node VSS.

Note that FIG. 6 illustrates the case where each memory cell is a split-gate flash memory element. Each memory cell may be a stacked-gate flash memory element. In that case, the memory gate selection line MGL is not provided.

The flash memory module 6 illustrated in FIG. 6 has features that it is possible to switch between the complementary reading system in which the storage of one bit of information is accomplished by use of two nonvolatile memory cells and the reference current reading system in which the storage of one bit of information is accomplished by use of one nonvolatile memory cell.

In the complementary reading system, one pair of rewritable nonvolatile memory cells coupled to the common word line WL are employed as a twin cell. The memory array 24 of FIG. 6 illustrates typically one pair of memory cells MC1 and MC2 which are coupled to the common word line WL. Similarly, the memory array 22 illustrates typically one pair of memory cells MC3 and MC4 which are coupled to the common word line WL. In the present specification, the memory cells MC1 and MC3 are called a positive cell, and the memory cells MC2 and MC4 are called a negative cell.

In the memory cells MC1 and MC2 which configures a twin cell, each memory gate MG is coupled to the corresponding common memory gate selection line MGL, and each control gate CG is coupled to the corresponding common word line WL. The source of each memory cell is coupled to the common source line SL. The memory cells MC1 and MC2 are further coupled to the corresponding sub bit line SBL in units of columns.

In the reference current reading system, one bit of data is stored in each of the memory cells MC1-MC4. In this case, there is no distinction between a positive cell and a negative cell.

The hierarchy sense amplifier band 23 includes a sense amplifier SA, a read column selector 25, and sub-bit-line selectors 26U and 26D.

The sense amplifier SA includes a first and a second input node, and amplifies the difference of a current which flows through a first output signal line CBLU coupled to the first input node and a current which flows through a second output signal line CBLD coupled to the second input node, thereby outputs the comparison result of both current values (in the following, the first output signal line CBLU is also called an upside output signal line, and the second output signal line CBLD is also called a downside output signal line). The output signal of the sense amplifier SA is transferred to the output buffer (OBUF) 34 via a read-system main bit line RMBL extending in the column direction. The output buffer 34 is coupled to a data bus HBUS-D of the high speed bus HBUS. The output buffer 34 supplies the output of the sense amplifier SA to the CPU 2, the DMAC 3, etc. illustrated in FIG. 1 via the high speed data bus HBUS-D.

The read column selector 25 includes PMOS transistors 51U-54U and 51D-54D. By switching these PMOS transistors, the read column selector 25 functions as a coupling switch unit which changes the coupling between each sub bit line SBL and the output signal lines CBLU and CBLD described above (Hereinafter, the MOS transistor employed as a switch as described above is also called a MOS transistor switch). Fundamentally, the sub bit line SBL employed by the upside memory array 22 is coupled to the upside output signal line CBLU via PMOS (Positive-channel MOS) transistor switches (such as 51U, 53U; 52U, 54U). Similarly, the sub bit line SBL employed by the downside memory array 24 is coupled to the downside output signal line CBLD via PMOS transistor switches (such as 51D, 53D; 52D, 54D).

The read column selector 25 further includes PMOS transistor switches 55U and 55D for coupling the negative cell to the output signal line (CBLU or CBLD) opposite to the coupling destination in the above-described fundamental case, when the complementary reading system is employed. For example, when reading the data of the twin cell configured with the memory cells MC1 and MC2, the memory cell MC1 is coupled to the downside output signal line CBLD via the PMOS transistor switches 53D and 51D. The memory cell MC2 is coupled to the upside output signal line CBLU via the PMOS transistor switches 54D and 55D. Similarly, when reading the data of the twin cell configured with the memory cells MC3 and MC4, the memory cell MC3 is coupled to the upside output signal line CBLU via the PMOS transistor switches 53U and 51U. The memory cell MC4 is coupled to the downside output signal line CBLD via the PMOS transistor switches 54U and 55U.

In the reference current reading system, the above-described PMOS transistor switches 55U and 55D are always in an OFF state. For example, when reading the data of the memory cell MC2 provided in the downside memory array 24, the memory cell MC2 is coupled to the downside output signal line CBLD via the PMOS transistor switches 54D and 52D. The upside output signal line CBLU is coupled to a reference current source (not shown). At this time, the sub bit line SBL provided in the memory cell MC4 is also coupled to the upside output signal line CBLU by setting the PMOS transistor switches 52U and 54U in an ON state. This is because wiring capacitance equivalent to wiring capacitance of the sub bit line SBL coupled to the downside output signal line CBLD is to be added to the upside output signal line CBLU as well.

The sub-bit-line selectors 26U and 26D include NMOS (Negative-channel MOS) transistor switches 60U and 60D. By switching ON and OFF of these NMOS transistor switches 60U and 60D, the corresponding sub bit line SBL is selectively coupled to the write-system main bit line WMBL. Specifically, a sub bit line SBL provided in the memory array 22 is coupled to the corresponding main bit line WMBL via the NMOS transistor switch 60U. A sub bit line SBL provided in the memory array 24 is coupled to the corresponding main bit line WMBL via the NMOS transistor switch 60D. In Embodiment 1, the sub-bit-line selectors 26U and 26D are employed only at the time of data write, and are not employed at the time of data read.

The first row decoder (RDEC1) 30 includes a driver 180 for activating the word line WL selectively. The second row decoder (RDEC2) 31 includes a driver 182 for activating the memory gate line MGL selectively, and a driver 183 for activating the source line SL selectively. The second row decoder 31 further includes a driver 184 for activating selectively a control signal line ZL which controls the sub-bit-line selectors 26U and 26D. This control signal line ZL is coupled to the gates of the NMOS transistor switches 60U and 60D provided in the sub-bit-line selectors 26U and 26D. The selection operation by the first row decoder 30 and the second row decoder 31 follows the address information supplied to the high-speed access port (HACSP) 15 illustrated in FIG. 1 in the read access, and follows the address information supplied to the low-speed access port (LACSP) 14 illustrated in FIG. 1 in the write operation of data and the initialization operation (Erase Operation)

The flash memory module 6 further includes an input/output buffer (IOBUF) 33, a main-bit-line voltage control circuit 39, a column decoder (CDEC) 32, a rewriting column selector 38, a verification circuit 37, a power supply circuit (VPG) 35, and a timing generator (TMG) 36.

The input/output buffer (IOBUF) 33 is coupled to a data bus PBUS-D (hereinafter called a peripheral data bus PBUS-D) of the peripheral bus (PBUS) 13, via the low-speed access port (LACSP) 14. The input/output buffer 33 is supplied with write data via the peripheral data bus PBUS-D. Furthermore, the input/output buffer 33 outputs a determination result of the verification sense amplifier VSA to the peripheral data bus PBUS-D.

The main-bit-line voltage control circuit 39 includes a program latch circuit PRGL provided corresponding to the write-system main bit line WMBL. The program latch circuit PRGL holds the write data supplied via the input/output buffer 33. In the case of data write, a write current according to the data ("1" or "0") held at the program latch circuit PRGL flows through the write-system main bit line WMBL selectively.

The column decoder (CDEC) 32 generates a control signal for selecting the write-system main bit line WMBL according to the address information supplied to the low-speed access port (LACSP) 14 of FIG. 1.

The rewriting column selector 38 includes an NMOS transistor switch 80B for coupling selectively each of the write-system main bit lines WMBL and the verification sense amplifier VSA, and an NMOS transistor switch 80L for coupling selectively the input/output buffer 33 and the program latch circuit PRGL. The NMOS transistor switches 80B and 80L switch to ON or OFF according to the control signal from the column decoder 32. When the NMOS transistor switch 80L is set to ON, write data is supplied from the input/output buffer 33 to the corresponding program latch circuit PRGL.

The verification circuit 37 determines whether the data of the memory cell as a write target and the write data held in the program latch circuit PRGL coincide, and determines whether the desired data is written in the memory cell as the write target. The verification circuit 37 includes a verification sense amplifier VSA for reading the data of the memory cell as the write target. The verification sense amplifier VSA is coupled to the write-system main bit line WMBL corresponding to the memory cell as the write target, by the selection operation of the rewriting column selector 38 (that is, according to the corresponding NMOS transistor switch 80B set to ON).

The power supply circuit (VPG) 35 generates various operating voltages necessary for read, write, and initialization (erase). Among the voltages generated, a supply voltage (voltage of the power supply node VDD) is a supply voltage of the CMOS circuit in the semiconductor device. The voltages supplied to the memory gate line MG, the control gate CG, the source line SL, the well (WELL), and the bit line BL are generated and supplied by the power supply circuit (VPG) 35 under the control of the flash sequencer 7.

The timing generator (TMG) 36 generates an internal control signal for specifying internal operation timing, according to an access strobe signal supplied from the CPU 2 of FIG. 1 to the high-speed access port (HACSP) 15 and an access command supplied from the flash sequencer (FSQC) 7 to the high-speed access port 15. The controller of the flash memory 16 is configured with the flash sequencer (FSQC) 7 illustrated in FIG. 1 and the timing generator 36.

(Details of the Read-System Circuit)

Figure 7:
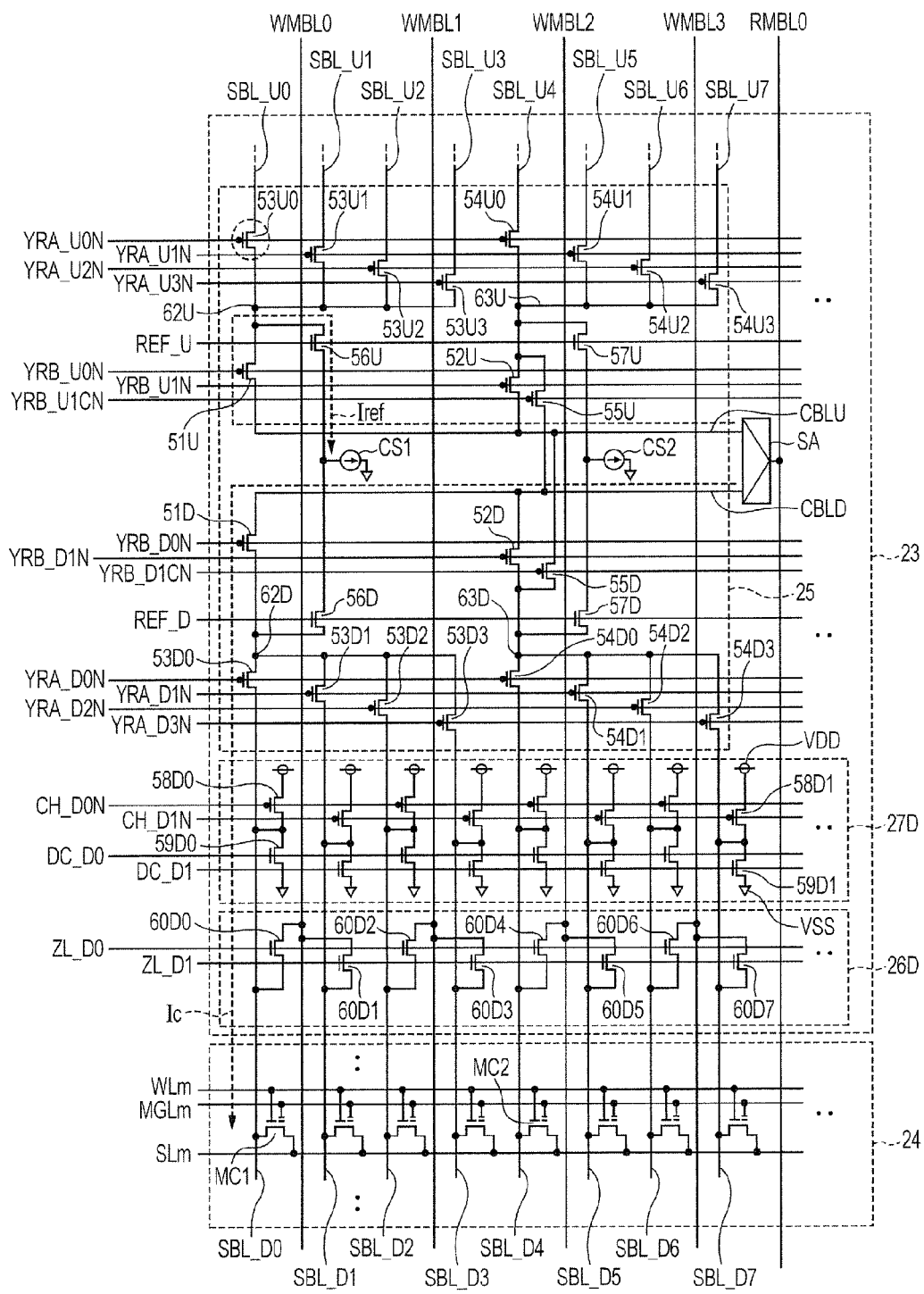
FIG. 7 is a drawing illustrating the detailed configuration of a hierarchy sense amplifier band illustrated in FIG. 6.

FIG. 7 is a drawing illustrating the detailed configuration of the hierarchy sense amplifier band illustrated in FIG. 6. Specifically, FIG. 7 illustrates the configuration of the sense amplifier SA, the read column selector 25, and the downside sub-bit-line selector 26D among the hierarchy sense amplifier band 23, and the configuration of the downside memory array 24 in the mth row, illustrated in FIG. 6. FIG. 7 also illustrates the configuration of a charging and discharging circuit 27D provided between the read column selector 25 and the sub-bit-line selector 26D. Although not shown in FIG. 7, a charging and discharging circuit 27U having the similar configuration of the charging and discharging circuit 27D is provided also between the read column selector 25 and the upside sub-bit-line selector 26U.

FIG. 7 illustrates typically four write-system main bit lines WMBL0-WMBL3, eight sub bit lines SBL_U0-SBL_U7 provided in the upside memory array 22, eight sub bit lines SBL_D0-SBL_D7 provided in the downside memory array 24, and one read-system main bit line RMBL0. Although not shown in FIG. 7, these bit lines are repeatedly provided in the row direction in the actual memory cell module 6.

Two sub bit lines SBL are assigned to one write-system main bit line WMBL for every memory array. Specifically, in the downside memory array 24, the sub bit lines SBL_D2×i and SBL_D2×i+1 (i=0-3) are assigned to the write-system main bit line WMBLi. In the upside memory array 22, the sub bit lines SBL_U2×i and SBL_U2×i+1 (i=0-3) are assigned to the write-system main bit line WMBLi.

In the complementary reading system, memory cells which are coupled to mutually different sub bit lines SBL, and coupled to the common word line WL configure a twin cell. Specifically, in the case of FIG. 7, among the memory cells coupled to the sub bit lines SBL_D0 and SBL_D4, the memory cells coupled to the common word line WL configure a twin cell. Similarly, the memory cells coupled to the sub bit lines SBL_Di and SBL_Di+4 (i=0-3) configure a twin cell. The memory cells coupled to the sub bit lines SBL_D0-SBL_D3 are used as a positive cell, and the memory cells coupled to the sub bit lines SBL_D4-SBL_D7 are used as a negative cell. Same applies to the memory cells provided in the upside memory array 22.

The sub-bit-line selector 26D includes NMOS transistor switches 60D0-60D7 respectively corresponding to the sub bit lines SBL_D0-SBL_D7, and control signal lines ZL_D0 and ZL_D1. Each of the NMOS transistor switches 60D0-60D7 is coupled between the corresponding sub bit line SBL and the write-system main bit line WMBL assigned to the corresponding sub bit line SBL. The control signal line ZL_D0 is coupled to the gates of the even-numbered NMOS transistor switches 60D0, 60D2, 60D4, and 60D6, and the control signal line ZL_D1 is coupled to the gates of the odd-numbered NMOS transistor switches 60D1, 60D3, 60D5, and 60D7.

The charging and discharging circuit 27D includes PMOS transistor switches 58D0 which correspond individually to the even-numbered sub bit lines SBL_D0, SBL_D2, SBL_D4, and SBL_D6, PMOS transistor switches 58D1 which correspond individually to the odd-numbered sub bit lines SBL_D1, SBL_D3, SBL_D5, and SBL_D7, and control signal lines CH_D0N and CH_D1N. Each of the PMOS transistor switches 58D0 and 58D1 is coupled between the corresponding sub bit line SBL and the power supply node VDD. The control signal line CH_D0N is coupled to the gates of the even-numbered PMOS transistors 58D0, and the control signal line CH_D1N is coupled to the gates of the odd-numbered PMOS transistors 58D1.

The charging and discharging circuit 27D further includes NMOS transistor switches 59D0 which correspond individually to the even-numbered sub bit lines SBL_D0, SBL_D2, SBL_D4, and SBL_D6, NMOS transistor switches 59D1 which correspond individually to the odd-numbered sub bit lines SBL_D1, SBL_D3, SBL_D5, and SBL_D7, and control signal lines DC_D0 and DC_D1. Each of the NMOS transistor switches 59D0 and 59D1 is coupled between the corresponding sub bit line SBL and the ground node VSS. The control signal line DC_D0 is coupled to the gates of the even-numbered NMOS transistors 59_D0, and the control signal line DC_D1 is coupled to the gates of the odd-numbered NMOS transistors 59D1.

The configuration of the charging and discharging circuit 27U corresponds to the configuration of the discharging circuit 27D described above in which the subscript D is replaced with the subscript U. Accordingly, the explanation thereof is not repeated.

The read column selector 25 includes PMOS transistor switches 51D, 52D, 53D0-53D3, and 54D0-54D3, for coupling selectively the sub bit lines SBL_D0-SBL_D7 provided in the downside memory array 24 to the downside output signal line CBLD. The read column selector 25 further includes PMOS transistor switches 51U, 52U, 53U0-53U3, and 54U0-54U3, for coupling selectively the sub bit lines SBL_U0-SBL_U7 provided in the upside memory array 22 to the upside output signal line CBLU.

The concrete connecting relation of the above-described PMOS transistor switch is as follows. First, the PMOS transistor switches 53D0-53D3 correspond to the sub bit lines SBL_D0-SBL_D3, respectively, and each is coupled between the corresponding sub bit line SBL and a common node 62D, respectively. The PMOS transistor switch 51D is coupled between the common node 62D and the downside output signal line CBLD. The PMOS transistor switches 54D0-54D3 correspond to the sub bit lines SBL_D4-SBL_D7, respectively, and each is coupled between the corresponding sub bit line SBL and a common node 63D, respectively. The PMOS transistor switch 52D is coupled between the common node 63D and the downside output signal line CBLD.

Similarly, the PMOS transistor switches 53U0-53U3 correspond to the sub bit lines SBL_U0-SBL_U3, respectively, and each is coupled between the corresponding sub bit line SBL and a common node 62U, respectively. The PMOS transistor switch 51U is coupled between the common node 62U and the upside output signal line CBLU. The PMOS transistor switches 54U0-54U3 correspond to the sub bit lines SBL_U4-SBL_U7, respectively, and each is coupled between the corresponding sub bit line SBL and a common node 63U, respectively. The PMOS transistor switch 52U is coupled between the common node 63U and the upside output signal line CBLU.

The read column selector 25 further includes control signal lines YRB_D0N, YRB_D1N, YRA_D0N-YRA_D3N, YRB_U0N, YRB_U1N, and YRA_U0N-YRA_U3N, for switching ON and OFF of the PMOS transistor switches described above. Specifically, the control signal lines YRB_D0N and YRB_D1N are coupled to the gates of the PMOS transistor switches 51D and 52D, respectively. The control signal line YRA_DiN (i=0-3) is coupled to the gates of the PMOS transistor switches 53Di and 54Di. Each control signal line YRA_DiN is coupled to two PMOS transistor switches 53Di and 54Di in order to select simultaneously two sub bit lines SBL corresponding to a twin cell.

Similarly, the control signal lines YRB_U0N and YRB_U1N are coupled to the gates of the PMOS transistor switches 51U and 52U, respectively. The control signal line YRA_UiN (i=0-3) is coupled to the gate of the PMOS transistor switches 53Ui and 54Ui.

The read column selector 25 further includes constant current sources CS1 and CS2, NMOS transistor switches 56U and 57U for switching coupling between these constant current sources CS1 and CS2 and the upside output signal line CBLU, respectively, and NMOS transistor switches 56D and 57D for switching coupling between these constant current sources CS1 and CS2 and the downside output signal line CBLD, respectively. The NMOS transistor switches 56U and 56D are coupled between the common nodes 62U and 62D and the constant current source CS1, respectively. The NMOS transistor switches 57U and 57D are coupled between the common nodes 63U and 63D and the constant current source CS2, respectively. The read column selector 25 further includes a control signal line REF_U coupled to the gates of the NMOS transistor switches 56U and 57U, and a control signal line REF_D coupled to the gates of the NMOS transistor switches 56D and 57D.

The above-described constant current sources CS1 and CS2 are configured with an NMOS transistor to which a constant voltage is applied at the gate thereof, for example. It is also preferable to configure the hierarchy sense amplifier band 23 so that a reference cell corresponding to the constant current sources CS1 and CS2 is provided in each memory array and a current flowing through the reference cell is compared with a current flowing through a memory cell as a read target.

The read column selector 25 further includes a PMOS transistor switch 55D for switching the coupling between the negative cell of the downside memory array 24 and the upside output signal line CBLU, and a PMOS transistor switch 55U for switching the coupling between the negative cell of the upside memory array 22 and the downside output signal line CBLD. The PMOS transistor switch 55D is coupled between the common node 63D and the upside output signal line CBLU, and the PMOS transistor switch 55U is coupled between the common node 63U and the downside output signal line CBLD.

The reference symbol ending with N in the notation of the control signal line described above designates that the control signal line concerned is activated by a low level (L level) signal and the PMOS transistor switch coupled to the activated control signal line concerned is set to ON. The reference symbol not ending with N in the notation of the control signal line described above designates that the control signal line concerned is activated by a high level (H level) signal and the NMOS transistor switch coupled to the activated control signal line concerned is set to ON.

(On the Path of a Memory Cell Current and a Reference Current in the Reference Current Reading System)

Next, with reference to FIG. 7, the following explains on the path of a cell current Ic and the path of a reference current Iref, in reading the data of the memory cell MC1 in the reference current reading system.

When reading the data of the memory cell MC1, a word line WLm coupled to the control gate of memory cell MC1 is activated to an H level. Furthermore, a cell current Ic is generated by activating the control signal lines YRA_D0N and YRB_D0N. The cell current Ic flows in the direction from the sense amplifier SA to the source line SL, via the output signal line CBLD, the PMOS transistor switches 51D and 53D0, the sub bit line SBL_D0, and the memory cell MC1 in this order. At the time of data read, the source line SL is coupled to the ground node VSS.

In order to generate the reference current Iref, the control signal lines YRB_U0N and REF_U are activated. The reference current Iref flows in the direction from the sense amplifier SA to the ground node VSS, via the output signal line CBLU, the PMOS transistor switch 51U, the NMOS transistor switch 56U, and the current source CS1 in this order. The magnitude of the reference current Iref is adjusted by the current source CS1.

When generating the reference current Iref, the PMOS transistor switch 53U0 is further set to ON by activating the control signal line YRA_U0N. Accordingly, the wiring capacitance of the sub bit line SBL_U0 is added to the output signal line CBLU on the side of the current source CS1. The wiring capacitance of the sub bit line SBL_U0 has the almost same value as the wiring capacitance of the sub bit line SBL_D0 coupled to the memory cell MC1. Accordingly, it is possible to make the load of the first input node and the load of the second input node almost equal, in the sense amplifier SA. Therefore, it is possible to make an exact comparison of the cell current Ic and the reference current Iref (that is, exact detection of the data of the memory cell MC1).

The sense amplifier SA amplifies the difference of the cell current Ic and the reference current Iref. The output signal of the sense amplifier SA is transferred to the output buffer OBUF via the read-system main bit line RMBL0.

In the reference current reading system, the control signal lines YRB_U1CN and YRB_D1CN are always maintained in an inactive state (H level). That is, the PMOS transistor switches 55U and 55D are always in an OFF state.

(On the Path of a Memory Cell Current in the Complementary Reading System)

Figure 8:
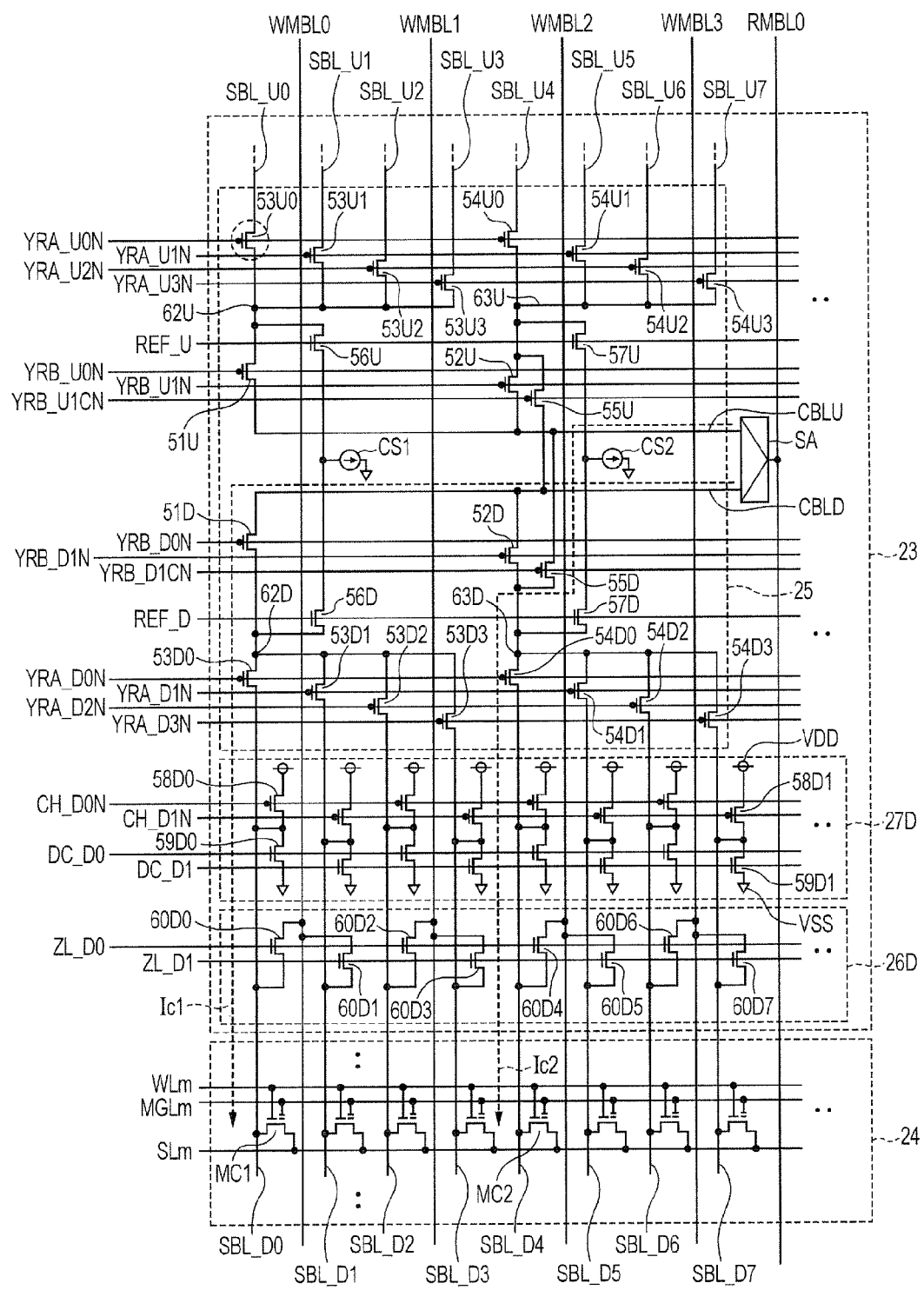
FIG. 8 is a drawing illustrating a path of a memory cell current in the complementary reading system in the circuit configuration of FIG. 7.

FIG. 8 is a drawing illustrating the path of a memory cell current in the complementary reading system in the circuit configuration of FIG. 7. When reading the data of the memory cells MC1 and MC2 configuring a twin cell, the path of a cell current Ic1 flowing through the memory cell MC1 and the path of a cell current Ic2 flowing through the memory cell MC2 are illustrated in FIG. 8.

When reading the data of the memory cells MC1 and MC2, the word line WLm coupled common to the memory cells MC1 and MC2 is activated. In this state, the control signal lines YRA_D0N, YRB_D0N, and YRB_D1CN are activated to generate the cell currents Ic1 and Ic2. The cell current Ic1 flows in the direction from the sense amplifier SA to the source line SL, via the output signal line CBLD, the PMOS transistor switches 51D and 53D0, the sub bit line SBL_D0, and the memory cell MC1 in this order. The cell current Ic2 flows in the direction from the sense amplifier SA to the source line SL, via the output signal line CBLU, the PMOS transistor switches 55D and 54D0, the sub bit line SBL_D4, and the memory cell MC2 in this order. At the time of data read, the source line SL is coupled to the ground node VSS.

The sense amplifier SA amplifies the difference of the cell current Ic1 and the cell current Ic2. The output signal of the sense amplifier SA is transferred to the output buffer OBUF via the read-system main bit line RMBL0.

In the complementary reading system, the control signal lines REF_U and REF_D are always deactivated to an L level, and the control signal lines YRB_U1N and YRB_D1N are always deactivated to an H level. That is, the NMOS transistors 56U, 56D, 57U, and 57D and the PMOS transistors 52U and 52D are always in an OFF state.

(On a Driver Circuit of the Control Signal Line of the Hierarchy Sense Amplifier Band)

FIGS. 9A and 9B are drawings illustrating the configuration of a driver circuit for driving each control signal line in the hierarchy sense amplifier band illustrated in FIG. 7. FIG. 9A illustrates the configuration of a driver circuit for control signal lines related to the read and write of the upside memory array 22 illustrated in FIG. 6, and FIG. 9B illustrates the configuration of a driver circuit for control signal lines related to the read and write of the downside memory array 24 illustrated in FIG. 6.

Among the input signals of FIG. 9A and FIG. 9B, a control signal CMPLON is a signal for distinguishing between the complementary reading system and the reference current reading system to be applied to the memory cell as a read target and a write target. The control signal CMPLON is supplied from the flash sequencer (FSQC) 7 illustrated in FIG. 1. In the complementary reading system, the control signal CMPLON is set at an H level ("1"), and in the reference current reading system, the control signal CMPLON is set at an L level ("0").

Other input signals are generated by the column decoder (CDEC) 32, based on a control signal from the flash sequencer (FSQC) 7, a control signal from the timing generator 36 illustrated in FIG. 6, and an address supplied to the input/output buffer (IOBUF) 33. In particular, control signals YRA_U0_in-YRA_U3_in and YRA_D0_in-YRA_D3_in are the column selection signals based on the lower address, and control signals YRB_U0_in-YRB_U3_in and YRB_D0_in-YRB_D3_in are the column selection signals based on the upper address.

With reference to FIG. 9A, signals supplied to control signal lines ZL_U0, ZL_U1, DC_U0, and DC_U1 are generated by the buffers 101, 102, 105, and 106, respectively by amplifying control signals ZL_U0_in, ZL_U1_in, DC_U0_in, and DC_U1_in. Similarly, with reference to FIG. 9 (B), signals supplied to control signal lines ZL_D0, ZL_D1, DC_D0, and DC_D1 are generated by the buffers 127, 128, 125, and 126, respectively by amplifying control signals ZL_D0_in, ZL_D1_in, DC_D0_in, and DC_D1_in.

With reference to FIG. 9A, signals supplied to control signal lines CH_U0N, CH_U1N, YRA_U0N-YRA_U3N, and YRB_U0N are generated by the inverters 103, 104, 107-110, and 112, respectively by inverting and amplifying control signals CH_U0_in, CH_U1_in, YRA_U0_in-YRA_U3_in, and YRB_U0_in. Similarly, with reference to FIG. 9 (B), signals supplied to control signal lines CH_D0N, CH_D1N, YRA_D0N-YRA_D3N, and YRB_D0N are generated by the inverters 123, 124, 119-122, and 115, respectively by inverting and amplifying control signals CH_D0_in, CH_D1_in, YRA_D0_in-YRA_D3_in, and YRB_D0_in.

With reference to FIG. 9A, signals supplied to control signal lines REF_U, YRB_U1N, and YRB_U1CN are generated by the logic gates 111, 113, and 114, respectively. Specifically, when the CMPLON="0" (the reference current reading system), the logic gate 111 outputs a signal obtained by amplifying a control signal REF_U_in, to a control signal line REF_U. When the CMPLON="1" (the complementary reading system), the logic gate 111 outputs a signal of an L level ("0") irrespective of the control signal REF_U_in, to deactivate the control signal line REF_U.

When the CMPLON="0" (the reference current reading system), the logic gate 113 outputs a signal obtained by inverting and amplifying a control signal YRB_U1_in to the control signal line YRB_U 1N. When the CMPLON="1" (the complementary reading system), the logic gate 113 outputs a signal of an H level ("1") irrespective of the control signal YRB_U1_in, to deactivate the control signal line YRB_U 1N.

When the CMPLON="0" (the reference current reading system), the logic gate 114 outputs a signal of an H level ("1") irrespective of the control signal YRB_U1_in, to deactivate the control signal line YRB_U1CN. When the CMPLON="1" (the complementary reading system), the logic gate 114 outputs a signal obtained by inverting and amplifying the control signal YRB_U0_in to the control signal line YRB_U1CN.

Similarly, with reference to FIG. 9 (B), signals supplied to control signal lines REF_D, YRB_D1N, and YRB_D1CN are generated by the logic gates 118, 116, and 117, respectively. Specifically, when the CMPLON="0" (the reference current reading system), the logic gate 118 outputs a signal obtained by amplifying a control signal REF_D in, to a control signal line REF_D. When the CMPLON="1" (the complementary reading system), the logic gate 118 outputs a signal of an L level ("0") irrespective of the control signal REF_D in, to deactivate the control signal line REF_D.

When the CMPLON="0" (the reference current reading system), the logic gate 116 outputs a signal obtained by inverting and amplifying a control signal YRB_D1_in, to the control signal line YRB_D1N. When the CMPLON="1" (the complementary reading system), the logic gate 116 outputs a signal of an H level ("1") irrespective of the control signal YRB_D1_in, to deactivate the control signal line YRB_D1N.

When the CMPLON="0" (the reference current reading system), the logic gate 117 outputs a signal of an H level ("1") irrespective of the control signal YRB_D1_in, to deactivate the control signal line YRB_D1CN. When the CMPLON="1" (the complementary reading system), the logic gate 117 outputs a signal obtained by inverting and amplifying the control signal YRB_D0_in, to the control signal line YRB_D1CN.

(An Example of a Generating Circuit of the Control Signal CMPLON)

Figure 10:
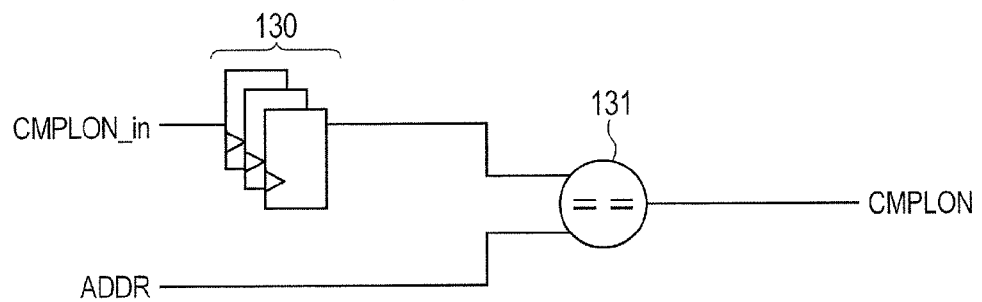
FIG. 10 is a drawing illustrating an example of a generating circuit of a control signal CMPLON illustrated in FIG. 9.

FIG. 10 is a drawing illustrating an example of a generating circuit of the control signal CMPLON illustrated in FIG. 9. The circuit illustrated in FIG. 10 is provided in the flash sequencer (FSQC) 7 illustrated in FIG. 6. This generating circuit includes plural registers 130 and a comparator 131.

The registers 130 are for storing in advance the address information of an region to be used by the complementary reading system among the memory arrays which configure the memory mat 20 illustrated in FIG. 6. The comparator 131 compares the externally-supplied address information ADDR with the address information stored in the registers 130, and when both are in agreement, the comparator 131 asserts the control signal CMPLON. By use of the circuit illustrated in FIG. 10, it is possible to determine whether the region to be accessed is used in the reference current reading system or the complementary reading system. By providing plural pieces of the circuit concerned, it is possible to determine for plural regions whether each of the regions is used in the reference current reading system or the complementary reading system.

When it is necessary to change the read timing, in the reference current reading system and the complementary reading system, the read timing signal generated by the timing generator 36 illustrated in FIG. 6 is changed based on the CMPLON signal, thereby attaining a stable read.

(An Example of the Configuration of the Sense Amplifier)

Figure 11:
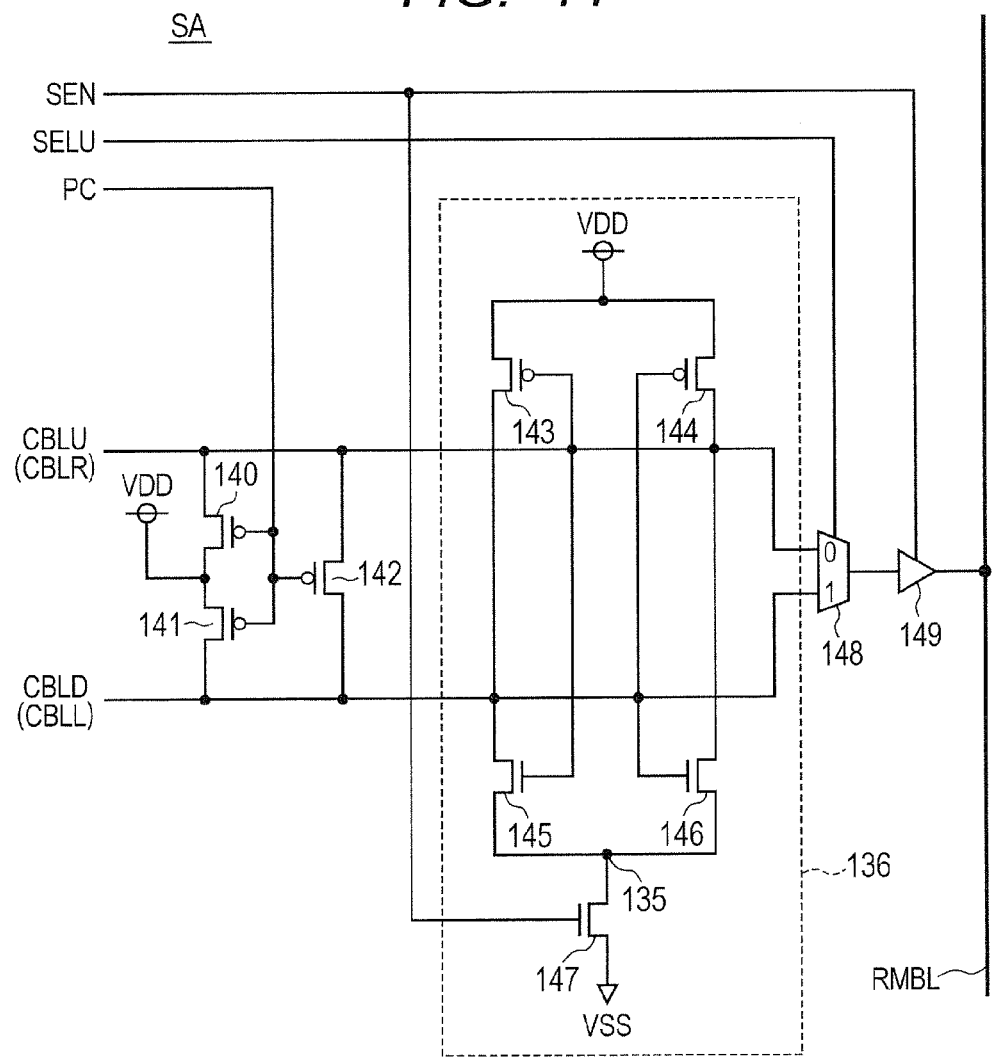
FIG. 11 is a circuit diagram illustrating an example of the configuration of a sense amplifier illustrated in FIG. 7 and FIG. 8.

FIG. 11 is a circuit diagram illustrating an example of the configuration of the sense amplifier illustrated in FIG. 7 and FIG. 8. With reference to FIG. 11, the sense amplifier SA includes PMOS transistors 140-144, NMOS transistors 145-147, a selector 148, and a three-state buffer 149.

The PMOS transistor 142 is coupled between the first output signal line CBLU and the second output signal line CBLD explained in FIG. 6. The PMOS transistors 140 and 141 are coupled between the first output signal line CBLU and the second output signal line CBLD, in series mutually and in parallel with the PMOS transistor 142. The coupling node of the PMOS transistors 140 and 141 is coupled to the power supply node VDD. A precharge signal PC is supplied to the gates of the PMOS transistors 140, 141, and 142.

As for the PMOS transistor 143, the source is coupled to the power supply node VDD, the drain is coupled to the output signal line CBLD, and the gate is coupled to the output signal line CBLU. As for the PMOS transistor 144, the source is coupled to the power supply node VDD, the drain is coupled to the output signal line CBLU, and the gate is coupled to the output signal line CBLD.

As for the NMOS transistor 145, the source is coupled to a node 135, the drain is coupled to the output signal line CBLD, and the gate is coupled to the output signal line CBLU. As for the NMOS transistor 146, the source is coupled to the node 135, the drain is coupled to the output signal line CBLU, and the gate is coupled to the output signal line CBLD. As for the NMOS transistor 147, the drain is coupled to the node 135 and the source is coupled to the ground node VSS. A sense enable signal SEN is supplied to the gate of the NMOS transistor 147.

A latch circuit 136 combining two inverters is configured with the PMOS transistors 143 and 144 and the NMOS transistors 145 and 146. When the sense enable signal SEN is set as an H level ("1"), the latch circuit 136 operates and the potential difference between the output signal lines CBLU and CBLD is amplified.

According to the selection signal SELU outputted by the flash sequencer (FSQC) 7, the selector 148 outputs the potential of the upside output signal line CBLU when the selection signal SELU is "0", and outputs the potential of the downside output signal line CBLD when the selection signal SELU is "1."

The three-state buffer 149 outputs a signal obtained by amplifying the output signal of the selector 148 to the read-system main bit line RMBL, when the sense enable signal SEN is at an H level ("1"). The output node of the three-state buffer 149 becomes high impedance when the sense enable signal SEN is at an L level ("1").

The details of the operation of the sense amplifier SA which has the configuration described above will be described later with reference to FIG. 14 and FIG. 15. In the following, only the outline of the operation of the sense amplifier SA is described. First, the precharge signal PC is set to an active state (L level) in advance, and in the state where the output signal lines CBLU and CBLD are precharged to the power supply potential, the memory cell or the reference current source as a read target is electrically coupled to each output signal line. Next, when the precharge signal PC is set to an H level, the cell current of different magnitude flows depending on the data stored in the memory cell as the read target; accordingly, a difference occurs between the potential of the upside output signal line CBLU and the potential of the downside output signal line CBLD. Next, when the sense enable signal SEN is set to an H level, the operation of the latch circuit 136 is started. As a result, the potential difference between the output signal lines CBLU and CBLD is amplified. The potential of the output signal line selected by the selector 148 is outputted to the read-system main bit line RMBL via the three-state buffer 149.

(An Example of the Configuration of the Output Buffer)

Figure 12:
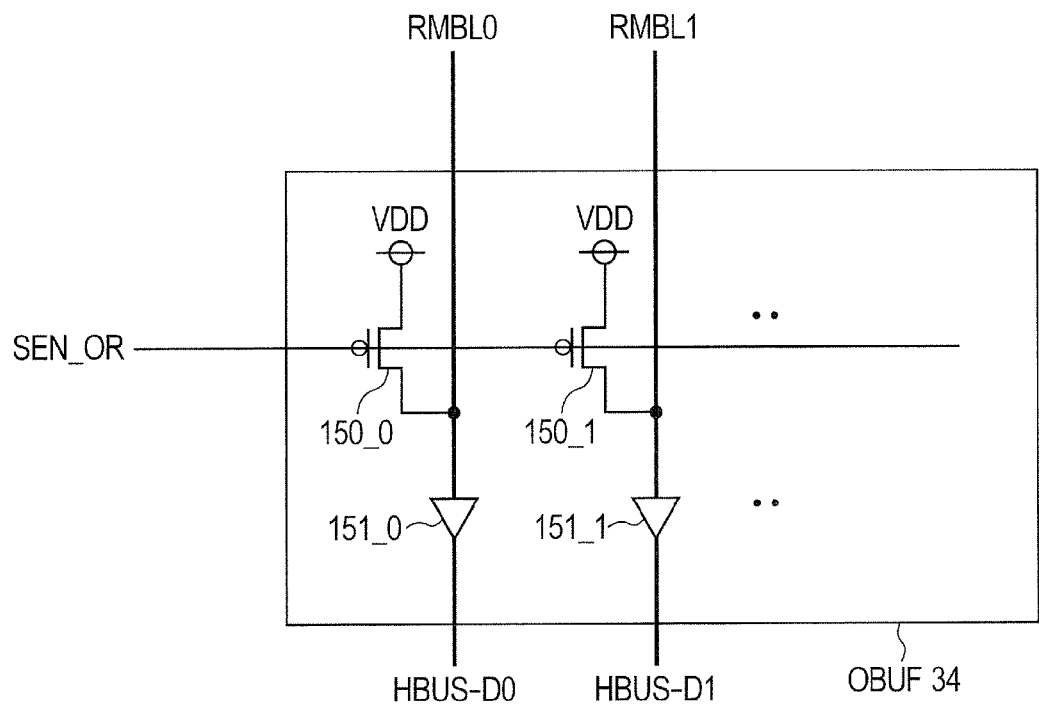
FIG. 12 is a circuit diagram illustrating an example of the configuration of an output buffer illustrated in FIG. 6.

FIG. 12 is a circuit diagram illustrating an example of the configuration of the output buffer illustrated in FIG. 6. FIG. 12 illustrates typically two read-system main bit lines RMBL0 and RMBL1.

With reference to FIG. 12, the output buffer (OBUF) 34 includes PMOS transistors 150_0, 150_1, . . . , respectively corresponding to the read-system main bit lines RMBL0, RMBL1, . . . , and buffers 151_0, 151_1, . . . , respectively corresponding to the read-system main bit lines RMBL0, RMBL1, . . . .

The PMOS transistor 150 is coupled between the power supply node VDD and the corresponding read-system main bit line RMBL. A control signal SEN_OR is supplied in common to the gate of each PMOS transistor 150. When the control signal SEN_OR is at an L level, each PMOS transistor 150 is in an ON state. Therefore, the read-system main bit line is charged to the power supply potential. When the control signal SEN_OR is set at an H level, the potential of each read-system main bit line RMBL becomes equal to the output signal potential of the corresponding sense amplifier SA illustrated in FIG. 11. The buffer 151 amplifies the signal potential outputted to the corresponding read-system main bit line RMBL from each sense amplifier SA and outputs it to the corresponding data bus (HBUS-D0, HBUS-D1, . . . ) of the high speed bus (HBUS).

Figure 13:
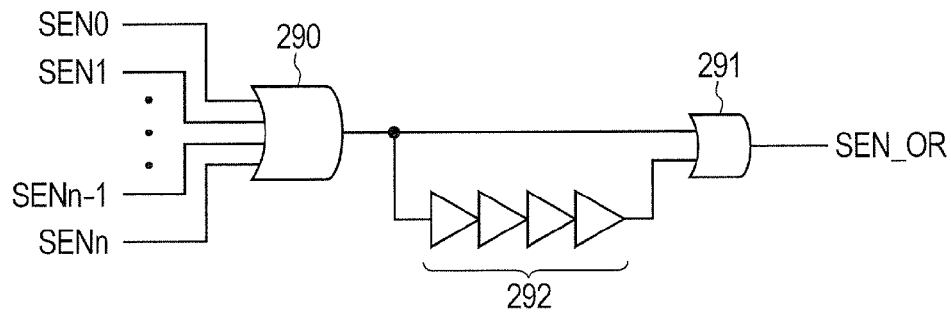
FIG. 13 is a drawing illustrating an example of a circuit for generating a control signal SEN_OR illustrated in FIG. 12.

FIG. 13 is a drawing illustrating an example of a circuit for generating the control signal SEN_OR illustrated in FIG. 12. The circuit illustrated in FIG. 13 is provided in the flash sequencer (FSQC) 7 illustrated in FIG. 6. Specifically, the circuit illustrated in FIG. 13 includes OR gates 290 and 291 and a delay circuit 292.

The OR gate 290 is supplied with sense enable signals SEN0_SENn which are inputted to the sense amplifiers SA provided respectively corresponding to the read-system main bit lines RMBL0-RMBLn. The OR gate 290 outputs the logical addition of these sense enable signals SEN0-SENn.

The delay circuit 292 is formed with the cascade connection of plural buffers. The OR gate 291 outputs the logical addition of the output signal of the OR gate 290 and the signal obtained by delaying this output signal by the delay circuit 292, as the control signal SEN_OR.

(Read Operation in the Reference Current Reading System)

Figure 14:
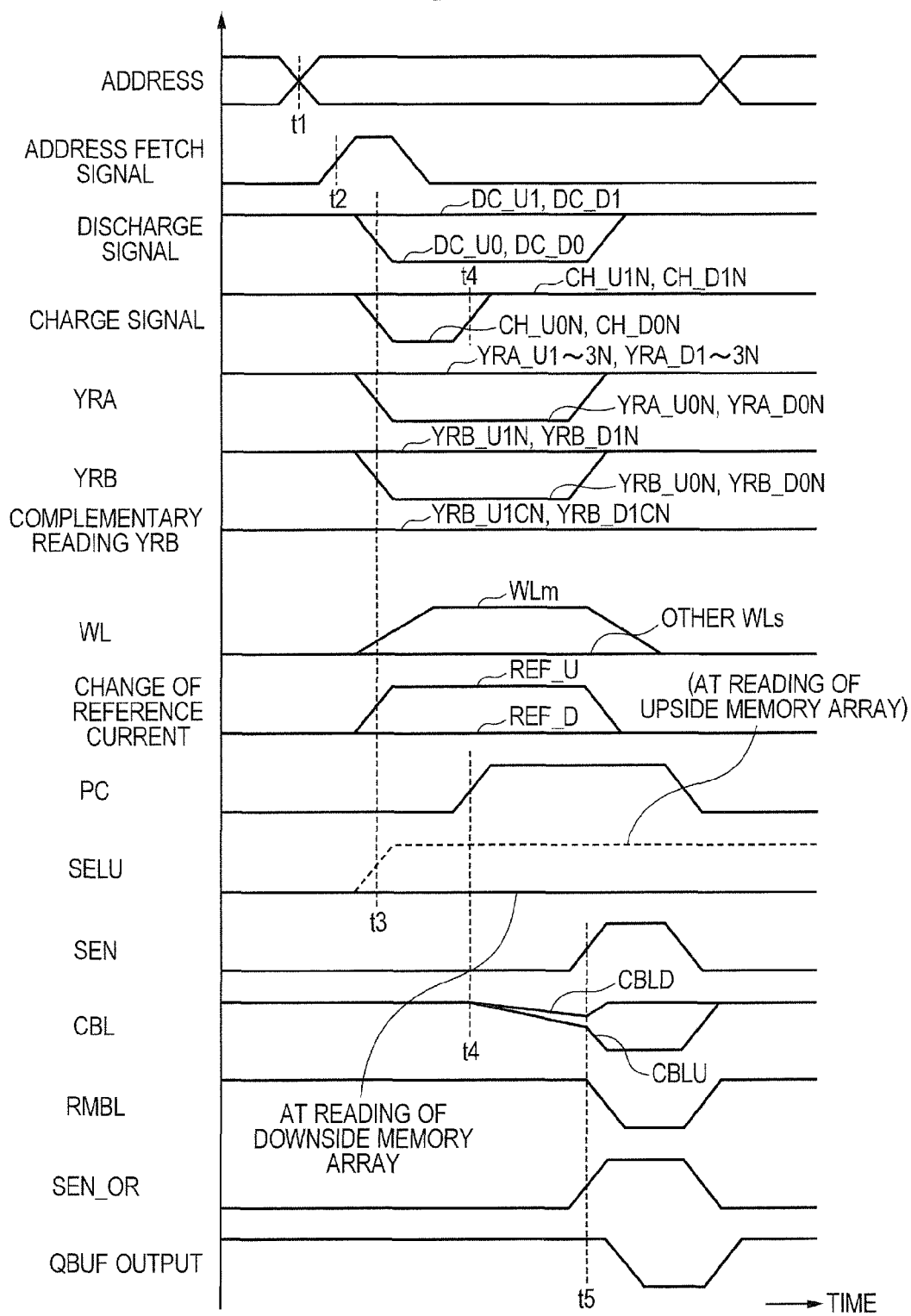
FIG. 14 is a timing chart illustrating an example of read operation in the reference current reading system.

FIG. 14 is a timing chart illustrating an example of read operation in the reference current reading system. With reference mainly to FIG. 6, FIG. 7, and FIG. 14, the following explains the procedure of the data read of the memory cell MC1 provided in the memory array 24, in the reference current reading system. In the following explanation, it is assumed that data "0" (a state of a high threshold voltage) is written in the memory cell MC1.

First, at time t1 of FIG. 14, the address information is switched. At time t2, the flash sequencer (FSQC) 7 illustrated in FIG. 1 outputs an address fetch signal. Responding to this signal, the input/output buffer (IOBUF) 33 fetches the address information. The fetched address information is decoded by the column decoder 32 and the row decoders 30 and 31.

At time t3, the driver provided in the row decoders 30 and 31 activates a control signal line necessary for the data read of the memory cell MC1 based on the address signal. Specifically, it is as follows.

(i) The discharge signal supplied to the control signal lines DC_U0 and DC_D0 is switched to an inactive state (L level), and the control signal lines DC_U1 and DC_D1 are maintained in an active state (H level). On the other hand, the charge signal supplied to the control signal lines CH_U0N and CH_D0N is switched to an active state (L level), and the control signal lines CH_U1N and CH_D1N are maintained in an inactive state (H level). Accordingly, at least the sub bit line SBL_D0 to which the memory cell MC1 as the read target is coupled, and the sub bit line SBL_U0 of the same column of the upside memory array 22 are precharged to the power supply potential, and the adjoining sub bit lines SBL_D1 and SBL_U1 are maintained to the ground potential. Accordingly, it is possible to make the adjacent sub bit line SBL serve as a ground shield, and to prevent malfunction due to undesirable capacity coupling.

(ii) The control signal lines YRA_U0N, YRA_D0N, YRB_U0N, and YRB_D0N are switched to an active state (L level). Accordingly, the sub bit lines SBL_D0 and SBL_U0 of the column corresponding to the memory cell MC1 are electrically coupled to the output signal lines CBLD and CBLU, respectively. The control signal lines YRB_U1CN and YRB_D1CN which are employed in the complementary reading system are maintained in an inactive state (H level).

(iii) By setting the control signal line REF_U to an active state (H level), the current source CS1 is electrically coupled to the upside output signal line CBLU.

(iv) The word line WLm coupled to the memory cell MC1 as the read target is switched to an active state (H level).

(v) When reading the data of the memory cell MC1 provided in the downside memory array, the selection signal SELU supplied to the selector 148 of the sense amplifier SA (refer to FIG. 11) is set at an L level ("0").

At the next time t4, the precharge signal PC supplied to the sense amplifier SA from the flash sequencer (FSQC) 7 is changed to an inactive state (H level), and the charge signal supplied to the control signal lines CH_U0N and CH_D0N from the driver of the row decoders 30 and 31 is changed to an inactive state (H level). As a result, the cell current Ic flows in the direction from the downside output signal line CBLD to the memory cell MC1 and the reference current Iref flows in the direction from the upside output signal line CBLU to the current source CS1. Since data "0" (a state of a high threshold voltage) is written in the memory cell MC1, the cell current Ic is smaller than the reference current Iref. Accordingly, the potential of the upside output signal line CBLU becomes lower than the potential of the downside output signal line CBLD.

At the next time t5, the flash sequencer (FSQC) 7 changes the sense enable signal SEN to be outputted to the sense amplifier SA to an active state (H level). Accordingly, the NMOS transistor 147 illustrated in FIG. 11 is set to ON, and the latch circuit 136 begins to operate. The latch circuit 136 amplifies the potential difference between the output signal lines CBLU and CBLD. As a result, the potential of the upside output signal line CBLU falls to the ground potential (VSS), and the potential of the downside output signal line CBLD rises to the power supply potential (VDD). The potential of the upside output signal line CBLU is outputted to the read-system main bit line RMBL via the selector 148 and the three-state buffer 149.

Furthermore, at time t5, when the sense enable signal SEN is activated, the control signal SEN_OR to be outputted to the output buffer (OBUF) 34 also changes to an active state (H level). Accordingly, the voltage signal outputted to the read-system main bit line RMBL is transferred to the output buffer (OBUF) 34 via the read-system main bit line RMBL from the sense amplifier SA and is outputted to the corresponding data bus of the high speed buses (HBUS) from the output buffer 34.

(Read Operation in the Complementary Reading System)

Figure 15:
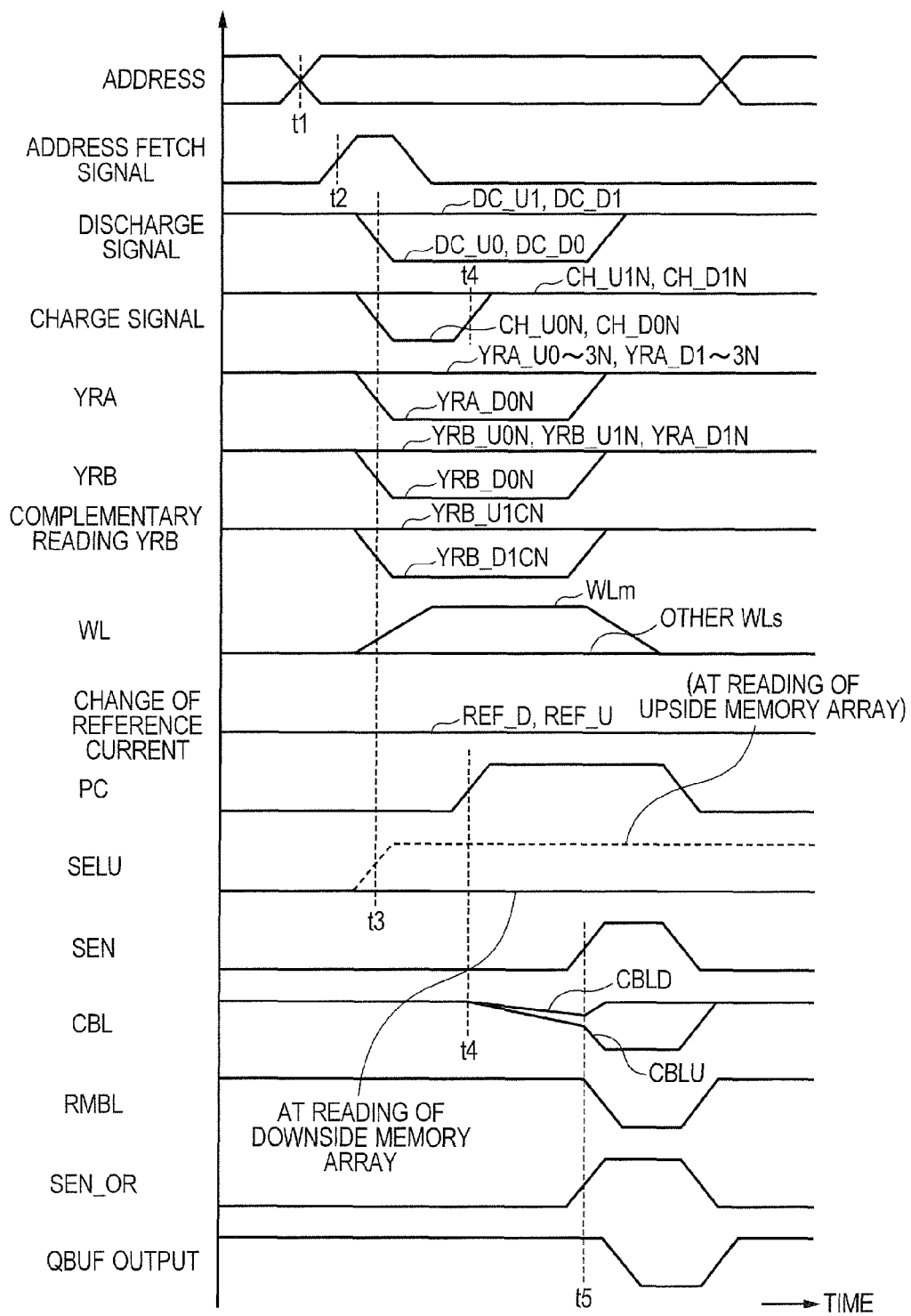
FIG. 15 is a timing chart illustrating an example of read operation in the complementary reading system.

FIG. 15 is a timing chart illustrating an example of read operation in the complementary reading system. With reference mainly to FIG. 6, FIG. 8, and FIG. 15, the following explains the procedure to read the data of the twin cell configured with memory cells MC1 and MC2 provided in the memory array 24, in the complementary reading system. In the following explanation, it is assumed that data "0" (a state of a high threshold voltage) is written in the memory cell MC1, and data "1" (a state of a low threshold voltage) is written in the memory cell MC2.

As is the case with FIG. 14, first at time t1 of FIG. 15, the read address is switched, and at time t2, an address fetch signal is outputted from the flash sequencer (FSQC) 7.

At time t3, the driver provided in the row decoders 30 and 31 activates a control signal line necessary for the data read of the memory cells MC1 and MC2 based on the address signal. Specifically, it is as follows.

(i) The discharge signal supplied to the control signal lines DC_U0 and DC_D0 is switched to an inactive state (L level), and the control signal lines DC_U1 and DC_D1 are maintained in an active state (H level). On the other hand, the charge signal supplied to the control signal lines CH_U0N and CH_D0N is switched to an active state (L level), and the control signal lines CH_U1N and CH_D1N are maintained in an inactive state (H level). Accordingly, at least the sub bit lines SBL_D0 and SBL_D4 to which the memory cells MC1 and MC2 as the read target are coupled, and the sub bit lines SBL_U0 and SBL_U4 of the same column of the upside memory array 22 are precharged to the power supply potential, and the adjoining sub bit lines SBL_D1, SBL_U1, SBL_D3, SBL_U3, SBL_D5, and SBL_U5 are maintained at the ground potential.

(ii) The control signal lines YRA_D0N, YRB_D0N, and YRB_D1CN are switched to an active state (L level). Accordingly, the sub bit lines SBL_D0 and SBL_D4 which are coupled to the memory cells MC1 and MC2 respectively, are electrically coupled to the output signal lines CBLD and CBLU, respectively.

(iii) The control signal lines REF_U and REF_D are maintained in an inactive state (L level). Therefore, the current sources CS1 and CS2 are not electrically coupled to the output signal lines CBLU and CBLD.

(iv) The word line WLm coupled common to the memory cells MC1 and MC2 as the read target is switched to an active state (H level).

(v) When the data of the memory cell MC1 provided in the downside memory array is read, the selection signal SELU supplied to the selector 148 of the sense amplifier SA (refer to FIG. 11) is set at an L level ("0").

At the next time t4, the precharge signal PC supplied to the sense amplifier SA by the flash sequencer (FSQC) 7 changes to an inactive state (H level), and the charge signal supplied to the control signal lines CH_U0N and CH_D0N by the driver of the row decoders 30 and 31 changes to an inactive state (H level). As a result, the cell current Ic1 flows in the direction from the downside output signal line CBLD to the memory cell MC1 and the cell current Ic2 flows in the direction from the upside output signal line CBLU to the memory cell MC2. Data "0" (a state of a high threshold voltage) is written in the memory cell MC1, and data "1" (a state of a low threshold voltage) is written in the memory cell MC2. Therefore, the cell current Ic1 is smaller than the cell current Ic2. Accordingly, the potential of the upside output signal line CBLU becomes lower than the potential of the downside output signal line CBLD.

At the next time t5, the flash sequencer (FSQC) 7 changes the sense enable signal to be outputted to the sense amplifier SA to an active state (H level). The subsequent operations are the same as those of the case of the reference current reading system, therefore, the repeated explanation thereof is omitted.

(Details of the Write-System Circuit)

Figure 16:
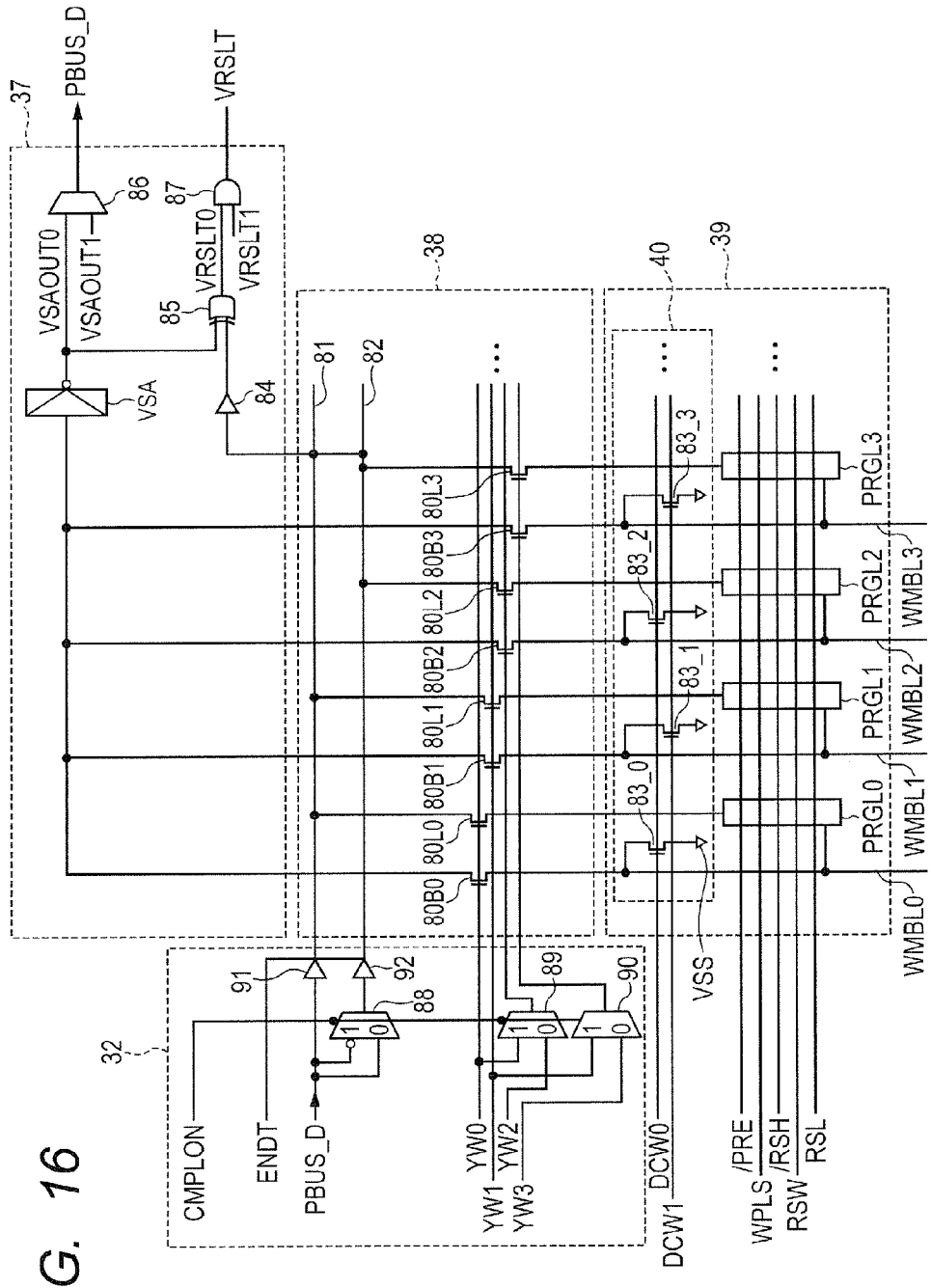
FIG. 16 is a circuit diagram illustrating the details of a write-system path illustrated in FIG. 6.

FIG. 16 is a circuit diagram illustrating the details of a write-system path illustrated in FIG. 6. FIG. 16 illustrates typically four write-system main bit lines WMBL0-WMBL3.

With reference to FIG. 16, the main-bit-line voltage control circuit 39 includes program latch circuits PRGL0-PRGL3 provided respectively corresponding to the write-system main bit lines WMBL0-WMBL3, and a write-system discharge circuit 40. In the case of data write, according to the data ("1" or "0") held at the program latch circuit PRGL, a write current flows through the write-system main bit line WMBL selectively. As described in FIG. 17, each program latch circuit PRGL operates according to control signals /PRE, WPLS, /RSH, RSW, and RSL, which are supplied from the flash sequencer (FSQC) 7.

The write-system discharge circuit 40 is a circuit which couples the write-system main bit line WMBL to the ground node VSS selectively according to discharge signals DCW0 and DCW1. The write-system discharge circuit 40 includes NMOS transistors 83_0-83_3 provided respectively corresponding to the write-system main bit lines WMBL0-WMBL3. Each NMOS transistor is coupled between the corresponding write-system main bit line WMBL and the ground node VSS. The discharge signal DCW0 is supplied to the gates of the even-numbered NMOS transistors 83_0 and 83_2, and the discharge signal DCW1 is supplied to the gates of the odd-numbered NMOS transistors 83_1 and 83_3.

By use of the write-system discharge circuit 40, it is possible to set at the ground potential a write-system main bit line WMBL which adjoins a write-system main bit line WMBL selected in the verifying operation after the data write. Accordingly, it is possible to make the write-system main bit line WMBL which adjoins the selected write-system main bit line WMBL serve as a ground shield, and to prevent malfunction due to undesirable capacity coupling.

The rewriting column selector 38 is a circuit for selecting the program latch PRGL to which the write data is inputted based on the write address, and for selecting the write-system main bit line WMBL coupled to the verification circuit 37. The rewriting column selector 38 includes input signal lines 81 and 82, NMOS transistor switches 80B0-80B3 and 80L0-80L3 for column selection, and control signal lines for supplying selection signals YM0-YM3 to the gate of the corresponding NMOS transistor switch, respectively.

The NMOS transistor switches 80B0-80B3 are inserted in the write-system main bit lines WMBL0-WMBL3, respectively. The NMOS transistor switches 80L0 and 80L1 correspond to the program latch circuits PRGL0 and PRGL1, respectively, and are coupled between the input signal line 81 and the corresponding program latch circuit. The NMOS transistor switches 80L2 and 80L3 correspond to the program latch circuits PRGL2 and PRGL3, respectively, and are coupled between the input signal line 82 and the corresponding program latch circuit. In order to make possible the simultaneous write of the complementary data which configures a twin cell, two input signal lines 81 and 82 are provided. The input signal line 81 corresponds to a positive cell, and the input signal line 82 corresponds to a negative cell.

The gates of the NMOS transistor switches 80Bi and 80Li corresponding to the common write-system main bit line WMBLi (i=0-4) are coupled to the common control signal line. The selection signal (YM0-YM4) supplied to each control signal line is supplied from the column decoder 32 as described later.

The column decoder (CDEC) 32 includes selectors 88-90 and three-state buffers 91 and 92 as apart of the configuration.

When a data transfer enable signal ENDT supplied from the flash sequencer (FSQC) 7 is in an active state (H level), the three-state buffer 91 amplifies the write data signal received via the data bus PBUS-D of the peripheral bus (PBUS) 13, and outputs it to the input signal line 81.

When the control signal CMPLON is at an H level ("1") (that is, in the complementary reading system), the selector 88 outputs a signal obtained by inverting the write data signal received via the data bus PBUS-D of the peripheral bus (PBUS) 13. When the control signal CMPLON is at an L level ("0") (that is, in the reference current reading system), the selector 88 outputs a signal obtained by amplifying the write data signal received via the data bus PBUS-D of the peripheral bus (PBUS) 13.

When the data transfer enable signal ENDT is in an active state (H level), the three-state buffer 92 supplies a signal obtained by amplifying the output signal of the selector 88, to the input signal line 82. Accordingly, when the control signal CMPLON is at an H level ("1") (that is, in the complementary reading system), the complementary write data is supplied to the input signal lines 81 and 82. The write data supplied to the input signal line 81 is held in the program latch circuit PRGL0 or PRGL1, and is written in a positive cell via the write-system main bit line SMBL0 or SMBL1. The write data supplied to the input signal line 82 is held in the program latch circuit PRGL2 or PRGL3, and is written in a negative cell via the write-system main bit line SMBL2 or SMBL3.

The selector 89 is supplied with selection signals YW0 and YW2. When the control signal CMPLON is at an H level ("1") (that is, in the complementary reading system), the selector 89 supplies the selection signal YW0 to the NMOS transistor switches 80B2 and 80L2. Accordingly, in the complementary reading system, both of the write-system main bit line WMBL0 and the program latch circuit PRGL0 which correspond to a positive cell, and the write-system main bit line WMBL2 and the program latch circuit PRGL2 which correspond to a negative cell become in a selected state. On the other hand, when the control signal CMPLON is at an L level ("0") (that is, in the reference current reading system), the selector 89 supplies the selection signal YW2 to the NMOS transistor switches 80B2 and 80L2.

The selector 90 is supplied with selection signals YW1 and YW3. When the control signal CMPLON is at an H level ("1") (that is, in the complementary reading system), the selector 90 supplies the selection signal YW1 to the NMOS transistor switches 80B3 and 80L3. Accordingly, in the complementary reading system, both of the write-system main bit line WMBL1 and the program latch circuit PRGL1 which correspond to a positive cell, and the write-system main bit line WMBL3 and the program latch circuit PRGL3 which correspond to a negative cell become in a selected state. On the other hand, when the control signal CMPLON is at an L level ("0") (that is, in the reference current reading system), the selector 90 supplies the selection signal YW3 to the NMOS transistor switches 80B3 and 80L3.

The selection signals YW0-YW3 are generated by the column decoder (CDEC) 32, on the basis of the control signal from the flash sequencer (FSQC) 7 illustrated in FIG. 1, the control signal from the timing generator 36 illustrated in FIG. 6, and the address inputted to the input/output buffer (IOBUF) 33.

The verification circuit 37 includes a verification sense amplifier VSA, a buffer 84, an exclusive OR gate 85, a selector 86, and an AND gate 87.

An input node of the verification sense amplifier VSA is coupled to the write-system main bit lines WMBL0-WMBL3, via the NMOS transistor switches 80B0-80B3, respectively. The verification sense amplifier VSA reads the data written in a memory cell as a write target via the write-system main bit line WMBL corresponding to the memory cell, and inverts and amplifies the signal.

An output signal VSAOUT0 of the verification sense amplifier VSA is supplied to the selector 86. Output signals VSAOUT1, . . . , of other verification sense amplifiers VSA are also supplied to the selector 86. The selector 86 outputs a signal selected from the output signals VSAOUT0, VSAOUT1, . . . , of the verification sense amplifiers VSA, to the data bus PBUS-D of the peripheral bus PBUS.

The output signal VSAOUT0 of the verification sense amplifier VSA is supplied also to one input node of the exclusive OR gate 85. The other input node of the exclusive OR gate 85 is supplied with the write data held in the program latch circuit PRGL after being coupled to the input signal lines 81 and 82 via the buffer 84. Accordingly, the exclusive OR gate 85 outputs a signal at an H level ("1") (a determination result VRSLT0), when the data of the memory cell as the write target and the write data held in the program latch circuit PRGL are in agreement.

The AND gate 87 is supplied with the determination results VRSLT0, VRSLT1, . . . , by the plural verification circuits 37. The AND gate 87 outputs a signal at an H level ("1") as a determination result VRSLT, when all of these determination results are "1."

(Details of the Program Latch Circuit)

Figure 17:
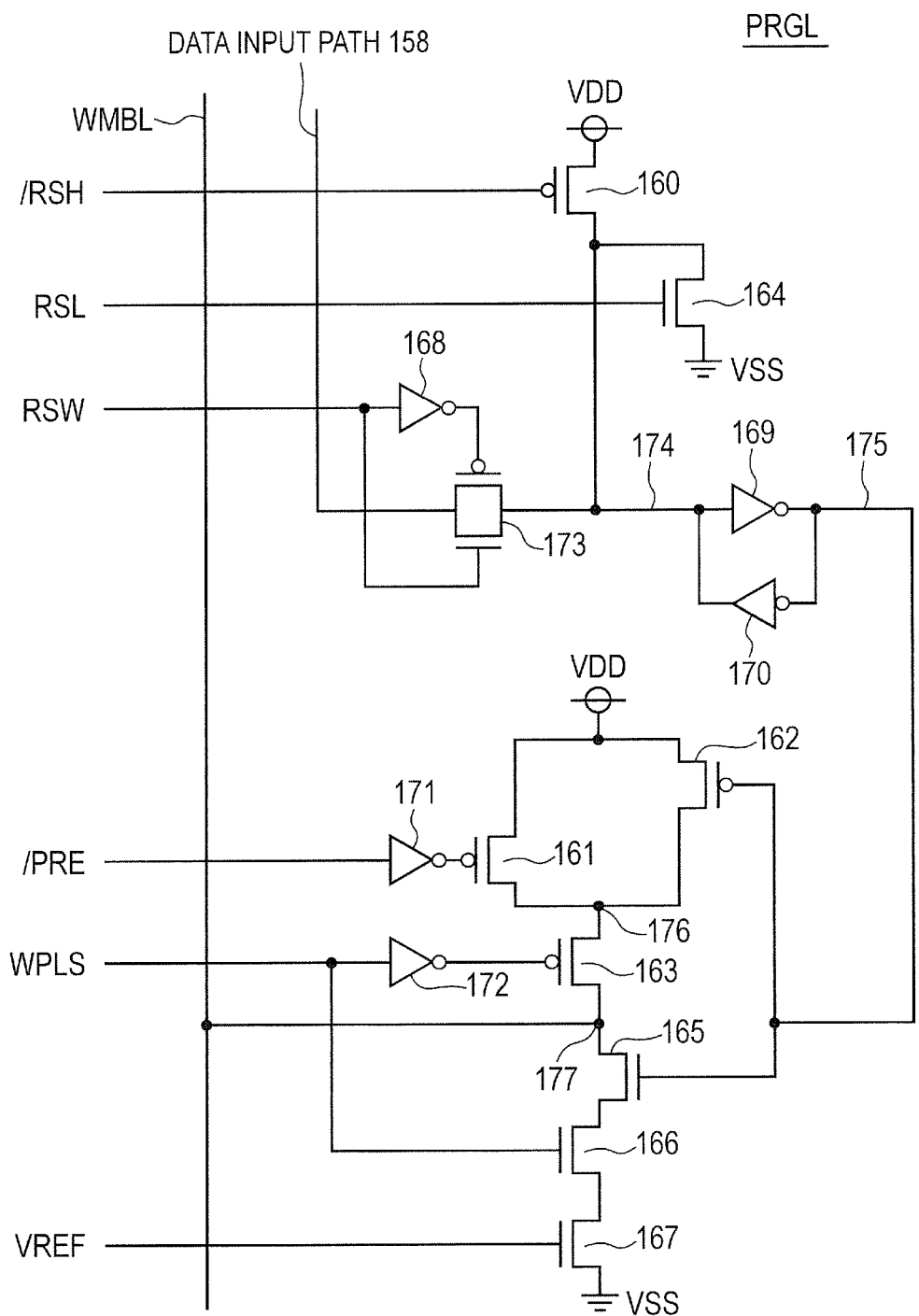
FIG. 17 is a circuit diagram illustrating the details of each of program latch circuits illustrated in FIG. 16.

FIG. 17 is a circuit diagram illustrating the details of each program latch circuit illustrated in FIG. 16. With reference to FIG. 17, the program latch circuit PRGL includes PMOS transistors 160-163, NMOS transistors 164-167, inverters 168-172, and a transmission gate 173.

The inverters 169 and 170 configure an inverter latch circuit and hold complementary data at holding nodes 174 and 175. The holding node 174 is coupled to the power supply node VDD via the PMOS transistor 160, and is coupled to the ground node VSS via the NMOS transistor 164. The gate of the PMOS transistor 160 is supplied with the control signal /RSH for setting the data held at the holding node 174 at an H level. The gate of the NMOS transistor 164 is supplied with the control signal RSL for setting the data held at the holding node 174 at an L level.

The holding node 174 is further coupled to a data input path 158 via the transmission gate 173. The data input path 158 is coupled to the input signal line 81 or 82 via one of the NMOS transistor switches 80L0-80L3 illustrated in FIG. 16. The control signal RSW for switching the acceptance/rejection of the input of the write data is supplied to the gate of a PMOS transistor which configures the transmission gate 173 via the inverter 168, and also supplied to the gate of an NMOS transistor which configures the transmission gate 173.

The PMOS transistors 161 and 162 are coupled in parallel between the power supply node VDD and the node 176. The gate of the PMOS transistor 161 is supplied with a program enable signal /PRE via the inverter 171. The gate of the PMOS transistor 162 is coupled to the holding node 175.

The PMOS transistor 163 and the NMOS transistors 165-167 are coupled in series in this order between the node 176 and the ground node VSS. The gate of the PMOS transistor 163 is supplied with a write pulse WPLS via the inverter 172. The gate of the NMOS transistor 165 is coupled to the holding node 175. The gate of the NMOS transistor 166 is supplied with the write pulse WPLS. The gate of the NMOS transistor 167 is supplied with a reference voltage VREF. A coupling node 177 of the NMOS transistors 163 and 165 is coupled to the corresponding write-system main bit line WMBL.

Accordingly, when the program enable signal /PRE is in an active state (L level), the write pulse WPLS is in an active state (H level), and the data currently held at the holding node 174 is L level ("0"), then the NMOS transistors 165-167 become in an ON state. Accordingly, a write current flows from the source line SL coupled to the memory cell of the write target to the ground node VSS, via the corresponding sub bit line SBL, the corresponding write-system main bit line WMBL, and the MOS transistors 165-167. At the time of data write, the source line SL is coupled to the power supply node which supplies a high voltage (for example, 6V).

(Write Operation of the Reference Current Reading System)

Hereinafter, with reference mainly to FIG. 16 and FIG. 17, and summarizing the explanation made so far, the write control in the reference current reading system is explained.

In the reference current reading system, data to be written in each memory cell is independent data. When data write is performed to the region where the data in the reference current reading system is stored, the write target address supplied from the exterior is different from the address indicating the complementary read region stored in the register 130 explained with reference to FIG. 10. Accordingly, the control signal CMPLON is in an inactive state ("0"). In this case, the data supplied from the data bus PBUS-D of the peripheral bus PBUS is stored directly to a program latch selected by the selection signals YW0-YW3 among the program latches PRGL0-PRGL3.

Data write to the memory cell as a write target is performed based on the data stored in the program latch PRGL. For example, when writing the data "0" (corresponding to the state of a high threshold voltage) in the memory cell MC2 illustrated in FIG. 7, the data "0" (L level) is stored in the holding node 174 of the program latch PRGL2. In this state, in FIG. 7, the control signal line ZL_D0 becomes in an active state (H level), the word line WLm is set at 1.5V, the memory gate line MGLm is set at 10V, and the source line SLm is set at 6V. Furthermore, the program enable signal /PRE is set in an active state (L level) and the write pulse WPLS is set in an active state (H level). As a result, the write current flows from the source line SLm to the ground node VSS, via the sub bit line SBL_D4, the write-system main bit line WMBL2, and the NMOS transistors 165-167 of the program latch PRGL2, in this order.

(Write Operation of the Complementary Reading System)

Hereinafter, with reference mainly to FIG. 16 and FIG. 17, and summarizing the explanation made so far, the write control in the complementary reading system is explained.

In the complementary reading system, it is necessary to write complementary data (data inverted mutually) in a pair of memory cells which configures a twin cell. When data write is performed to the region where the data in the complementary reading system is stored, the write target address supplied from the exterior agrees with the address indicating the complementary read region stored in the register 130 explained with reference to FIG. 10. Accordingly, the control signal CMPLON is in an active state ("1"). In this case, according to the selection signal YW0 or YW1, data supplied from the data bus PBUS-D of the peripheral bus PBUS is stored directly to a program latch PRGL which can be coupled to a positive cell configuring a twin cell. Data obtained by inverting the data supplied from the data bus PBUS-D of the peripheral bus PBUS is stored to a program latch PRGL which can be coupled to a negative cell configuring the twin cell.

The data write to the twin cell as a write target is performed based on the data stored in these two program latches PRGLs. For example, when data "0" (corresponding to the state of a high threshold voltage) is written in the memory cell MC1 and data "1" is written in the memory cell MC2 which are illustrated in FIG. 8, data "0" (L level) is stored at the holding node 174 of the program latch PRGL0, and data "1" (H level) is stored at the holding node 174 of the program latch PRGL2. In this state, in FIG. 7, the control signal line ZL_D0 becomes in an active state (H level), the word line WLm is set at 1.5V, the memory gate line MGLm is set at 10V, and the source line SLm is set at 6V. Furthermore, the program enable signal /PRE is set in an active state (L level), and the write pulse WPLS is set in an active state (H level). As a result, the write current flows from the source line SLm to the ground node VSS, via the sub bit line SBL_D0, the write-system main bit line WMBL0, and the NMOS transistors 165-167 of the program latch PRGL0, in this order. In the program latch PRGL2 corresponding to the memory cell MC2, the PMOS transistor 162 is in an ON state and the NMOS transistor 165 is in an OFF state. Therefore, the potential of the write-system main bit line WMBL2 becomes equal to the power supply potential, accordingly, no write current flows.

(Erase Operation)

When performing collective erasure of plural memory cells, the corresponding sub bit line SBL is set at a high impedance, the corresponding word line is set at 0V, the corresponding memory gate line is set at −10V, and the corresponding source line is set at 6V, as explained in FIG. 2B. In order to set the sub bit line SBL at a high impedance, the corresponding control signal lines YRA_U0N-YRA_U3N, YRA_D0N-YRA_D3N, CH_U0N-CH_U1N, and CH_D0N-CH_D1N are set in an inactive state (H level), and the corresponding control signal lines ZL_U0-ZL_U1, ZL_D0-ZL_D1, DC_U0-DC_U1, and DC_D0-DC_D1 are set in an inactive state (L level). The above-described erase operation is the same for the reference current reading system and the complementary reading system.

(Effect)

As described above, according to Embodiment 1, it is possible to provide the semiconductor device including the nonvolatile memory in which the reference current reading system and the complementary reading system can be changed. Accordingly, it becomes possible to change the memory size of the data area and the memory size of the code area.

<Embodiment 2>

When adopting the memory array structure in which the drain region of each memory cell is coupled to a sub bit line SBL via a contact hole and the source region of each memory cell is coupled to the source line SL via a contact hole, it is possible to provide a column of a unique memory cell in which the source region of the memory cell is not coupled to the source line (accordingly, not employed for data storage). In Embodiment 2, a sub bit line SBL coupled to this unique memory cell column is employed only for the wiring capacitance to be added to the signal output line in the reference current reading system. As described later, according to the present configuration, the MOS transistor switches provided in the hierarchy sense amplifier band can be separated into switches for access to the upside memory array 22 and switches for access to the downside memory array 24. Therefore, it is possible to enhance the degree of freedom in design.

The semiconductor device according to Embodiment 2 differs from the semiconductor device according to Embodiment 1 in that the unique memory cell column and the corresponding write-system main bit line and sub bit line are included in the memory mat as described above. Furthermore, the semiconductor device according to Embodiment 2 differs from the semiconductor device according to Embodiment 1 in that a MOS transistor switch and a control signal line are further provided in the hierarchy sense amplifier band, in order to switch the coupling between the sub bit line corresponding to the unique column and the output signal lines CBLU and CBLD, and in order to switch the coupling between the sub bit line corresponding to the unique column and the power supply node and the ground node. The other points of the semiconductor device according to Embodiment 2 are the same as the semiconductor device according to Embodiment 1. For example, the configuration of the semiconductor device illustrated in FIG. 1 and the basic configuration of the memory cell module illustrated in FIG. 6 apply similarly to the case of Embodiment 2. Accordingly, the explanation thereof is not repeated.

(Configuration of the Read-System Circuit)

Figure 18:
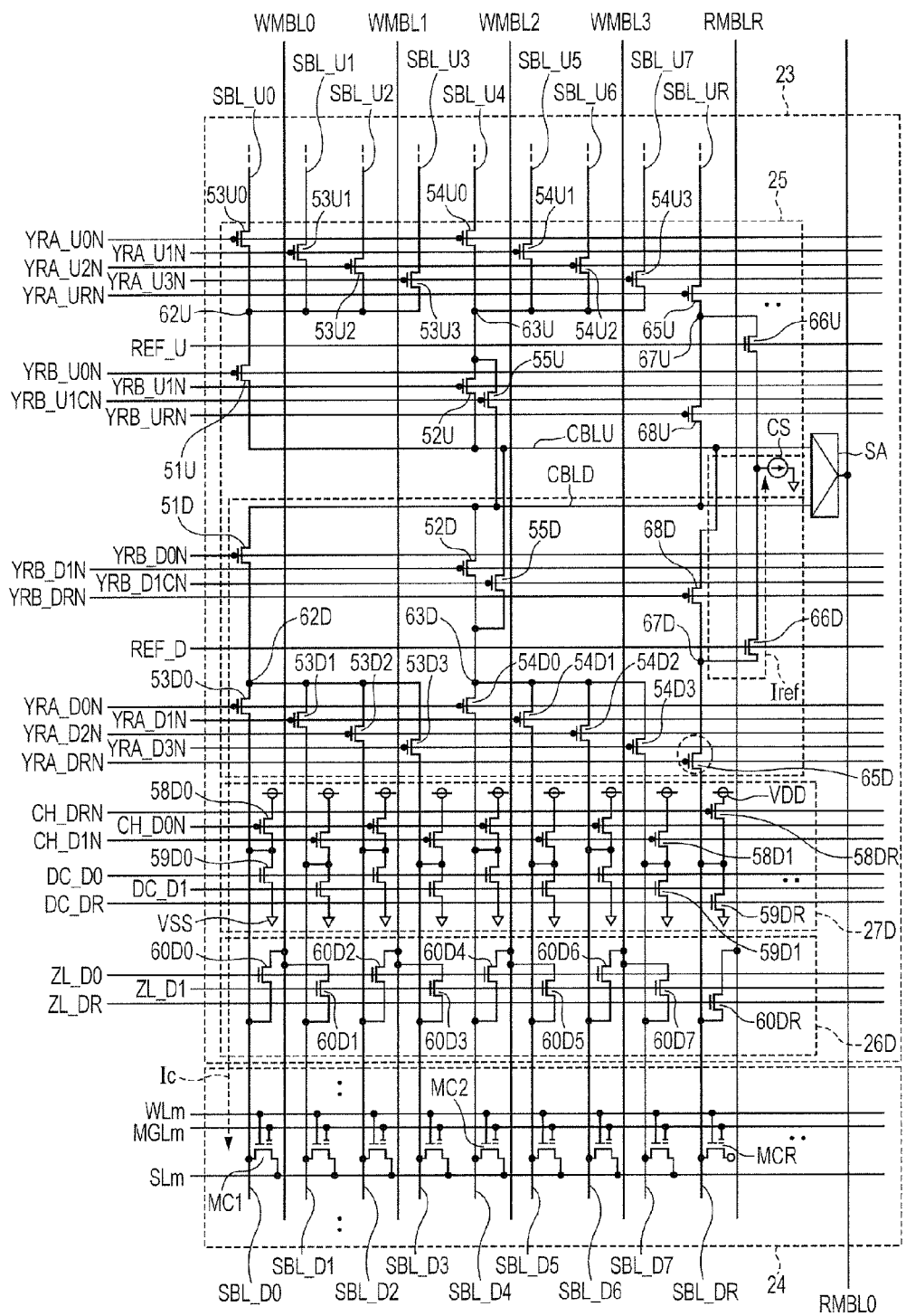
FIG. 18 is a drawing illustrating the detailed configuration of a hierarchy sense amplifier band according to Embodiment 2.

FIG. 18 is a drawing illustrating the detailed configuration of a hierarchy sense amplifier band according to Embodiment 2.

As is the case with Embodiment 1 illustrated in FIG. 7, FIG. 18 illustrates typically four write-system main bit lines WMBL0-WMBL3, eight sub bit lines SBL_U0-SBL_U7 corresponding to the upside memory array 22, eight sub bit lines SBL_D0-SBL_D7 corresponding to the downside memory array 24, and one read-system main bit line RMBL0.

In the case of FIG. 18, one main bit line WMBLR, one sub bit line SBL_UR corresponding to the upside memory array 22, and one sub bit line SBL_DR corresponding to the downside memory array 24 are added further. As described above, the source region of each memory cell MCR coupled to the added sub bit lines SBL_UR and SBL_DR is not coupled to the source line SL. Although not shown in FIG. 18, the plural bit lines described above are repeatedly provided in the row direction in the actual memory cell module 6.

The following explains the difference between the hierarchy sense amplifier band illustrated in FIG. 18 and the hierarchy sense amplifier band illustrated in FIG. 7. First, the sub-bit-line selector 26D differs from the sub-bit-line selector 26D illustrated in FIG. 7 in that an NMOS transistor switch 60DR coupled between the main bit line WMBLR and the sub bit line SBL_DR and a control signal line ZL_DR coupled to the gate of the NMOS transistor 60DR are further included. Also the upside sub-bit-line selector 26U differs from the case of FIG. 7 in the similar respects.

The charging and discharging circuit 27D differs from the charging and discharging circuit 27D illustrated in FIG. 7 in that a PMOS transistor switch 58DR coupled between the sub bit line SBL_DR and the power supply node VDD and an NMOS transistor switch 59DR coupled between the sub bit line SBL_DR and the ground node VSS are further included. The charging and discharging circuit 27D differs from the charging and discharging circuit 27D illustrated in FIG. 7 in that control signal lines CH_DRN and DC_DR coupled to the gates of MOS transistor switches 58DR and 59DR, respectively, are further included.

The read column selector 25 differs from the read column selector 25 illustrated in FIG. 7 in that PMOS transistor switches 68D and 65D and, control signal lines YRB_DRN and YRA_DRN coupled to the gates of the PMOS transistor switches 68D and 65D, respectively are further included. The PMOS transistor switches 68D and 65D are coupled in series in this order between the upside output signal line CBLU and the sub bit line SBL_DR provided in the downside memory array 24.

Similarly, the read column selector 25 differs from the read column selector 25 illustrated in FIG. 7 in that PMOS transistor switches 68U and 65U and control signal lines YRB_URN and YRA_URN coupled to the gates of the PMOS transistor switches 68U and 65U are further included. The PMOS transistor switches 68U and 65U are coupled in this order between the downside output signal line CBLD and the sub bit line SBL_UR provided in the upside memory array 22.

The read column selector 25 differs from the read column selector illustrated in FIG. 7 in that a current source CS and NMOS transistor switches 66U and 66D are included, in lieu of the current sources CS1, CS2, and the NMOS transistor switches 56U, 56D, 57U, and 57D. The NMOS transistor switch 66U is coupled between the current source CS and the coupling node 67U of the PMOS transistor switches 65U and 68U. The NMOS transistor switch 66D is coupled between the coupling node 67D of the PMOS transistor switches 65D and 68D, and the current source CS. The gates of the NMOS transistor switches 66U and 66D are coupled to the control signal line REF_U and REF_D, respectively.

(On the Path of a Memory Cell Current and a Reference Current in the Reference Current Reading System)

With reference to FIG. 18, the following explains on the path of a cell current Ic in reading the data of the memory cell MC1 and the path of a reference current Iref in the reference current reading system.

When reading the data of the memory cell MC1, a word line WLm coupled to the control gate of memory cell MC1 is activated to an H level. Furthermore, a cell current Ic is generated by activating the control signal lines YRA_D0N and YRB_D0N. The cell current Ic flows in the direction from the sense amplifier SA to the source line SL, via the output signal line CBLD, the PMOS transistor switches 51D and 53D0, the sub bit line SBL_D0, and the memory cell MC1 in this order.

In order to generate the reference current Iref, the control signal lines YRB_DRN and REF_D are activated. The reference current Iref flows in the direction from the sense amplifier SA to the ground node VSS, via the output signal line CBLU, the PMOS transistor switches 68D and 66D, and the current source CS in this order. The magnitude of the reference current Iref is adjusted by the current source CS.

When generating the reference current Iref, the PMOS transistor switch 65D is further set to ON by activating the control signal line YRA_DRN. Accordingly, the wiring capacitance of the sub bit line SBL_DR is added to the output signal line CBLU on the side of the current source CS. The wiring capacitance of the sub bit line SBL_DR has the almost same value as the wiring capacitance of the sub bit line SBL_D0 coupled to the memory cell MC1. It is possible to make the load of the first input node and the load of the second input node almost equal, in the sense amplifier SA. Therefore, it is possible to make an exact comparison of the cell current Ic and the reference current Iref (that is, exact detection of the data of the memory cell MC1).

The sense amplifier SA amplifies the difference of the cell current Ic and the reference current Iref. The output signal of the sense amplifier SA is transferred to the output buffer OBUF via the read-system main bit line RMBL0.

(On the Path of a Memory Cell Current in the Complementary Reading System)

Figure 19:
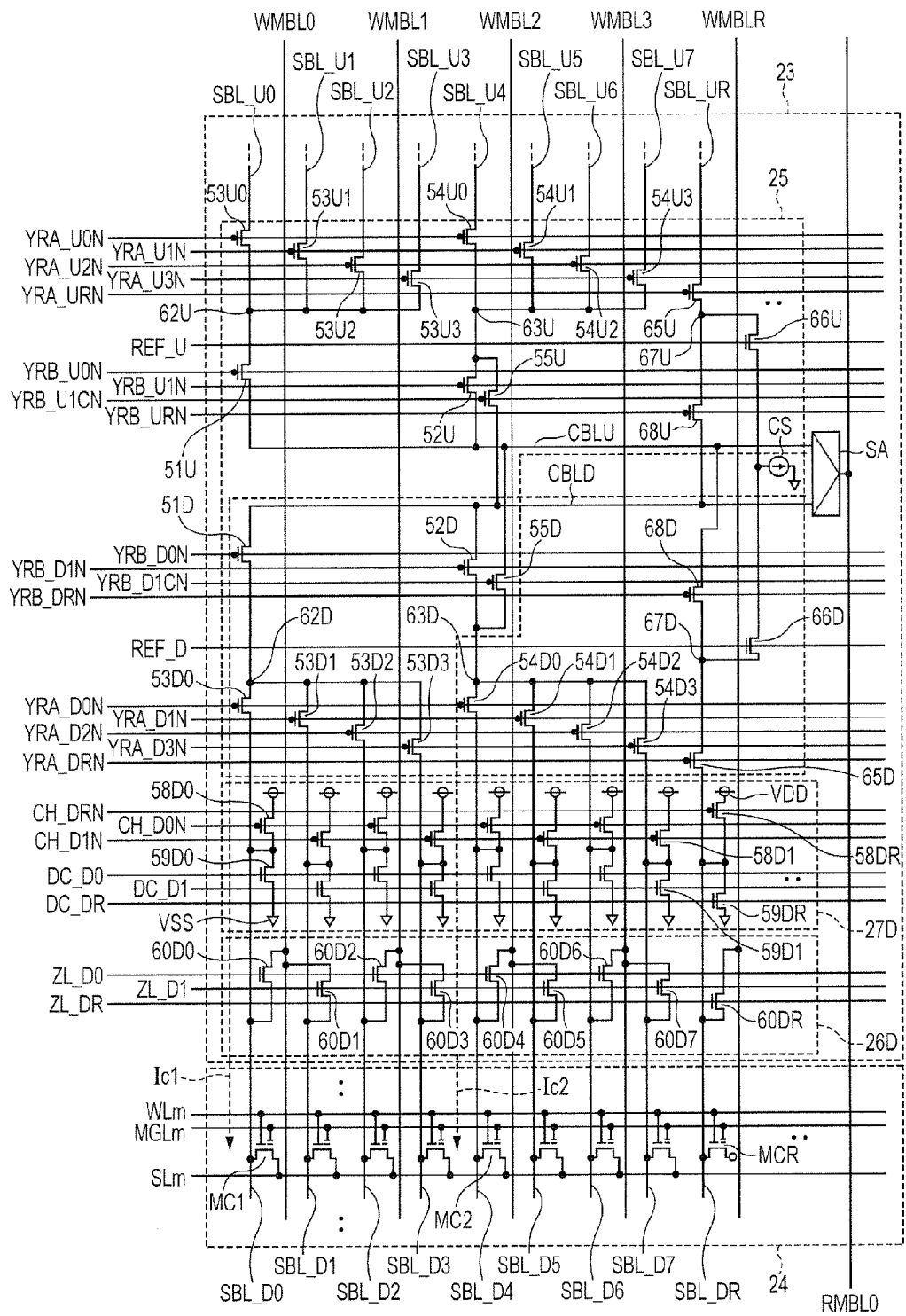
FIG. 19 is a drawing illustrating a path of a memory cell current in the complementary reading system in the circuit configuration of FIG. 18.

FIG. 19 is a drawing illustrating a path of a memory cell current in the complementary reading system in the circuit configuration illustrated in FIG. 18. When reading the data of the memory cells MC1 and MC2 configuring a twin cell, the path of a cell current Ic1 flowing through the memory cell MC1 and the path of a cell current Ic2 flowing through the memory cell MC2 are illustrated in FIG. 19. As illustrated in FIG. 19, the path of the cell currents Ic1 and Ic2 is the same as the case of FIG. 8, accordingly, the detailed explanation thereof is not repeated.

(On a Driver Circuit of the Control Signal Line of the Hierarchy Sense Amplifier Band)

Figure 20B:
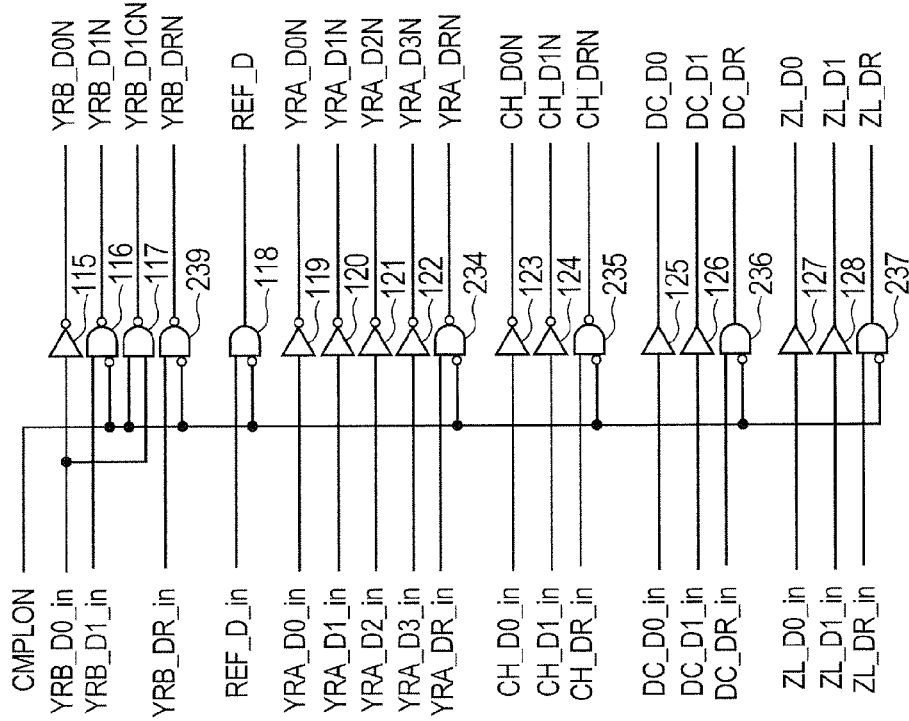
FIGS. 20A and 20B are drawings illustrating the configuration of a driver circuit for driving each control signal line in the hierarchy sense amplifier band illustrated in FIG. 18 and FIG. 19.
Figure 20A:
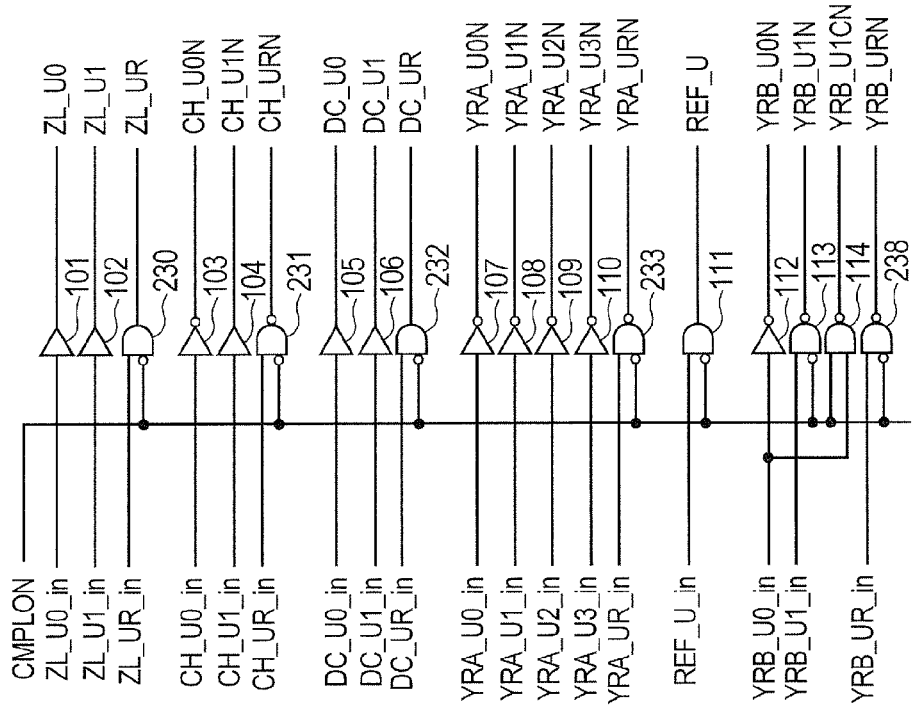

FIGS. 20A and 20B are drawings illustrating the configuration of a driver circuit for driving each control signal line in the hierarchy sense amplifier band illustrated in FIG. 18 and FIG. 19. FIG. 20A illustrates the configuration of a driver circuit for control signal lines related to the read and write of the upside memory array 22 illustrated in FIG. 6, and FIG. 20B illustrates the driver circuit for control signal lines related to the read and write of the downside memory array 24 illustrated in FIG. 6.

As is the case with FIGS. 9A and 9B of Embodiment 1, the control signal CMPLON is supplied from the flash sequencer (FSQC) 7 illustrated in FIG. 1. Other input signals are generated by the column decoder (CDEC) 32 based on a control signal from the flash sequencer (FSQC) 7, a control signal from the timing generator 36 illustrated in FIG. 6, and an address supplied to the input/output buffer (IOBUF) 33. As compared with FIGS. 9A and 9B, in FIGS. 20A and 20B, control signals ZL_UR_in, CH_UR_in, DC_UR_in, YRA_UR_in, YRA_DR_in, YRB_UR_in, YRB_DR_in, CH_DR_in, DC_DR_in, and ZL_DR_in are further supplied.

Signals supplied to the control signal lines ZL_UR and ZL_DR are generated by the logic gates 230 and 237, respectively. When the control signal CMPLON="1" (the complementary reading system), the signals supplied to the control signal lines ZL_UR and ZL_DR become at an L level ("0"). When the CMPLON="0" (the reference current reading system), signals obtained by amplifying the control signals ZL_UR_in and ZL_DR_in are supplied respectively to the control signal lines ZL_UR and ZL_DR.

Signals supplied to the control signal lines CH_URN and CH_DRN are generated by the logic gates 231 and 235, respectively. When the control signal CMPLON="1" (the complementary reading system), signals supplied to the control signal lines CH_URN and CH_DRN become at an H level ("1"). When the CMPLON="0" (the reference current reading system), signals obtained by inverting and amplifying the control signals CH_UR_in and CH_DR_in are supplied respectively to the control signal lines CH_URN and CH_DRN.

Signals supplied to the control signal lines DC_UR and DC_DR are generated by the logic gates 232 and 236, respectively. When the control signal CMPLON="1" (the complementary reading system), signals supplied to the control signal line DC_UR and DC_DR become at an L level ("0"). When the CMPLON="0" (the reference current reading system), signals obtained by amplifying the control signals DC_UR_in and DC_DR_in are supplied respectively to the control signal lines DC_UR and DC_DR.

Signals supplied to the control signal lines YRA_URN and YRA_DRN are generated by the logic gates 233 and 234, respectively. When the control signal CMPLON="1" (the complementary reading system), the signals supplied to the control signal lines YRA_URN and YRA_DRN become at an H level ("1"). When the CMPLON="0" (the reference current reading system), signals obtained by inverting and amplifying the control signals YRA_UR_in and YRA_DR_in are supplied respectively to the control signal lines YRA_URN and YRA_DRN.

Signals supplied to the control signal lines YRB_URN and YRB_DRN are generated by the logic gates 238 and 239, respectively. When the control signal CMPLON="1" (the complementary reading system), the signal supplied to the control signal lines YRB_URN and YRB_DRN become at an H level ("1"). When the CMPLON="0" (the reference current reading system), signals obtained by inverting and amplifying the control signals YRB_UR_in and YRB_DR_in are supplied respectively to the control signal lines YRB_URN and YRB_DRN.

(Read Operation in the Reference Current Reading System)

Figure 21:
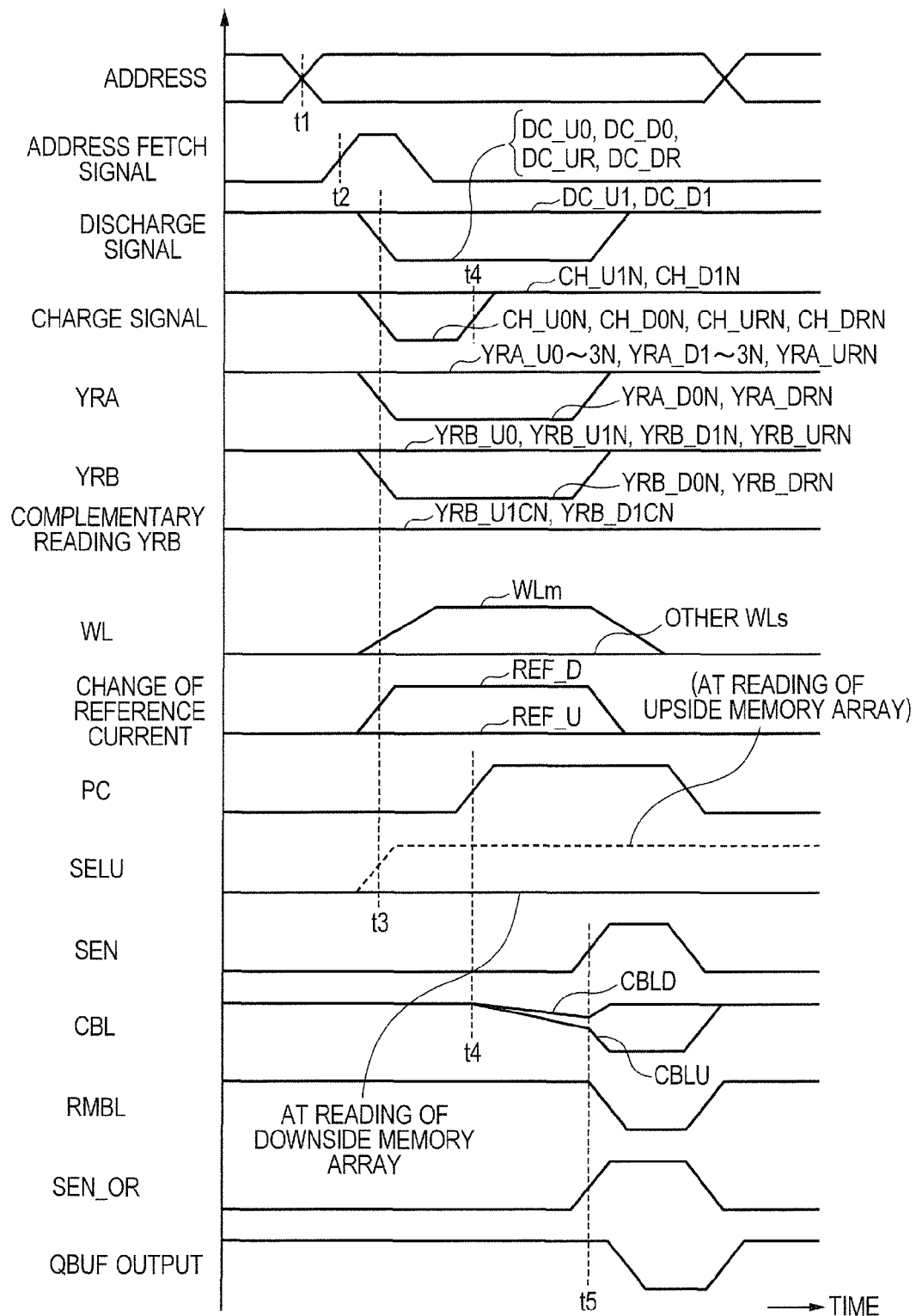
FIG. 21 is a timing chart illustrating an example of read operation in the reference current reading system according to Embodiment 2.

FIG. 21 is a timing chart illustrating an example of read operation in the reference current reading system according to Embodiment 2. The timing chart illustrated in FIG. 21 corresponds to the timing chart illustrated in FIG. 14 of Embodiment 1, and illustrates the operation of the data read of the memory cell MC1 provided in the memory array 24 in the reference current reading system. It is assumed that data "0" (a state of a high threshold voltage) is written in the memory cell MC1. Hereinafter, with reference mainly to FIG. 18 and FIG. 21, what is different from the timing chart illustrated in FIG. 14 of Embodiment 1 is explained; however, what is common to FIG. 14 is not explained repeatedly.

As is the case with FIG. 14, at time t1 of FIG. 21, the read address is switched, and at time t2, an address fetch signal is outputted from the flash sequencer (FSQC) 7.

At the next time t3, the driver provided in the row decoders 30 and 31 activates a control signal line necessary for the data read of the memory cell MC1 based on the address signal. What is different from the case of FIG. 14 is as follows.

(i) The discharge signal supplied to the control signal lines DC_UR and DC_DR is switched to an inactive state (L level), and the charge signal supplied to the control signal lines CH_URN and CH_DRN is switched to an active state (L level). Accordingly, the sub bit lines SBL_UR and SBL_DR which are added in Embodiment 2 are further precharged.

(ii) The control signal lines YRA_D0N, YRB_D0N, YRA_DRN, and YRB_DRN are switched to an active state (L level). Accordingly, the sub bit line SBL_D0 coupled to the memory cell MC1 is electrically coupled to the downside output signal line CBLD, and the sub bit line SBL_DR added in Embodiment 2 is electrically coupled to the upside output signal line CBLU. Unlike the case of FIG. 14, it is not necessary to electrically couple the sub bit line SBL_U0 to the upside output signal line CBLU. Therefore, the control signal lines YRA_U0N and YRB_U0N are maintained in an inactive state (H level). The control signal line YRB_URN is also maintained in an inactive state (H level).

(iii) Contrary to the case of FIG. 14, by setting the control signal line REF_D to an active state (H level), the current source CS is electrically coupled to the upside output signal line CBLU. The setup of other control signal lines is the same as the case of FIG. 14.

At the next time t4, the precharge signal PC supplied to the sense amplifier SA by the flash sequencer (FSQC) 7 changes to an inactive state (H level), and the charge signal supplied from the driver of the row decoders 30 and 31 to the control signal lines CH_U0N, CH_D0N, CH_URN, and CH_DRN changes to an inactive state (H level). As a result, the cell current Ic flows in the direction from the downside output signal line CBLD to the memory cell MC1, and the reference current Iref flows in the direction from the upside output signal line CBLU to the current source CS. Since the subsequent read operation is the same as the case of FIG. 14, the explanation thereof is not repeated.

(Read Operation in the Complementary Reading System)

Figure 22:
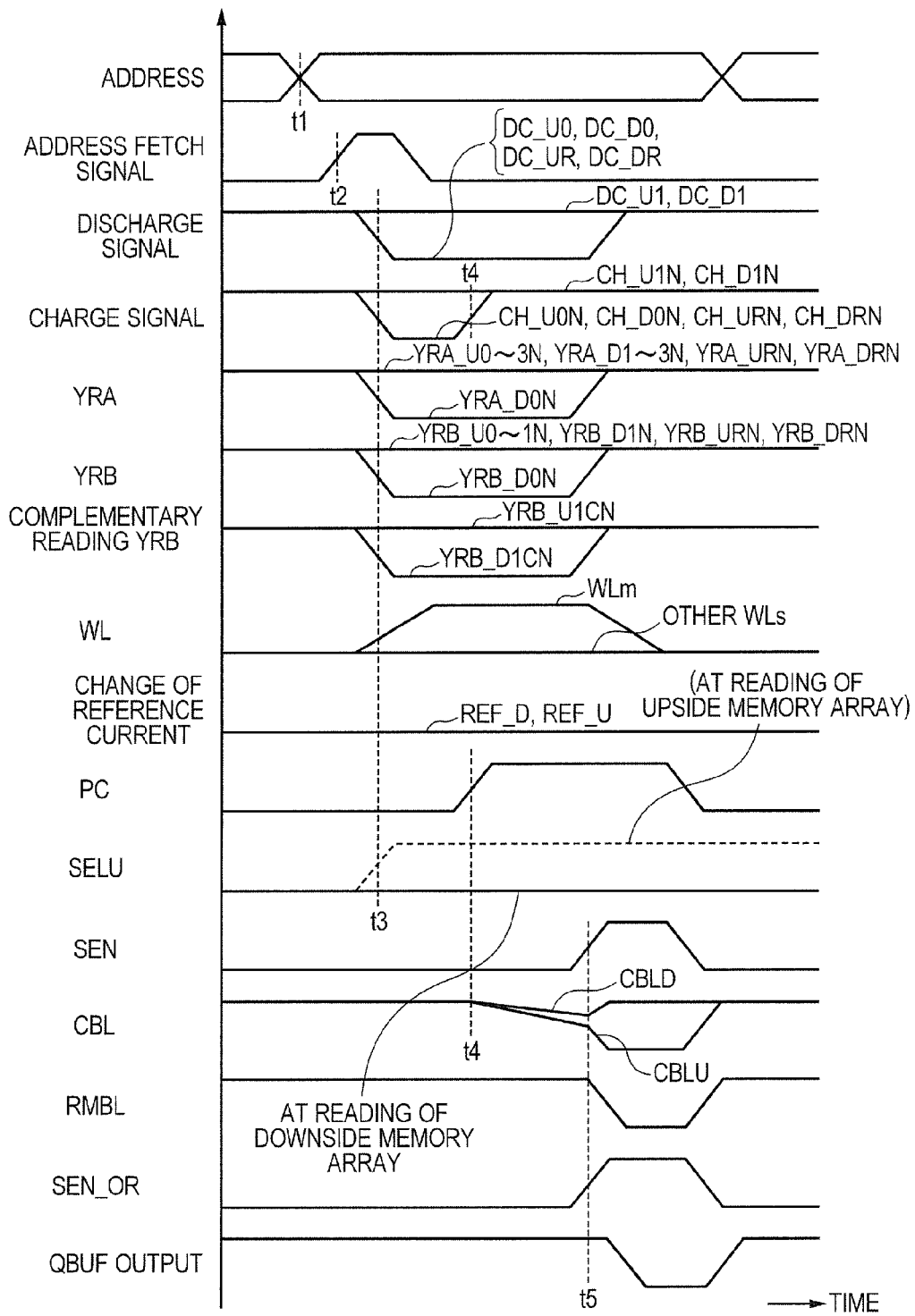
FIG. 22 is a timing chart illustrating an example of read operation in the complementary reading system according to Embodiment 2.

FIG. 22 is a timing chart illustrating an example of read operation in the complementary reading system according to Embodiment 2. The timing chart illustrated in FIG. 22 corresponds to the timing chart illustrated in FIG. 15 of Embodiment 1, and illustrates the data read of the twin cell configured with a memory cells MC1 and MC2 provided in the memory array 24 in the complementary reading system. It is assumed that data "0" (a state of a high threshold voltage) is written in the memory cell MC1, and data "1" (a state of a low threshold voltage) is written in the memory cell MC2. Hereinafter, with reference mainly to FIG. 19 and FIG. 22, what is different from the timing chart illustrated in FIG. 15 of Embodiment 1 is explained; however, what is common to FIG. 15 is not explained repeatedly.

As is the case with FIG. 15, first at time t1 of FIG. 22, the read address is switched, and at time t2, an address fetch signal is outputted from the flash sequencer (FSQC) 7.

At the next time t3, the driver provided in the row decoders 30 and 31 activates a control signal line necessary for the data read of the memory cells MC1 and MC2 based on the address signal. The feature point in comparison with the case of FIG. 15 is as follows.

(i) The discharge signal supplied to the control signal lines DC_UR and DC_DR is switched to an inactive state (L level), and the charge signal supplied to the control signal lines CH_URN and CH_DRN is switched to an active state (L level). Accordingly, the sub bit lines SBL_UR and SBL_DR which are added in Embodiment 2 are further precharged.

(ii) As is the case of FIG. 15, the control signal lines YRA_D0N, YRB_D0N, and YRB_D1CN are switched to an active state (L level). Accordingly, the sub bit lines SBL_D0 and SBL_D4 which are coupled to the memory cells MC1 and MC2 respectively, are electrically coupled to the output signal lines CBLD and CBLU, respectively. The control signal lines YRA_URN, YRA_DRN, YRB_URN, and YRB_DRN which are added in Embodiment 2 are maintained in an inactive state (H level).

(iii) As is the case of FIG. 15, the control signal lines REF_U and REF_D are maintained in an inactive state (L level). Therefore, the current source CS is not electrically coupled to the output signal lines CBLU and CBLD. The setup of other control signal lines is the same as the case of FIG. 15.

At the next time t4, the precharge signal PC supplied to the sense amplifier SA by the flash sequencer (FSQC) 7 changes to an inactive state (H level), and the charge signal supplied from the driver of the row decoders 30 and 31 to the control signal lines CH_U0N, CH_D0N, CH_URN, and CH_DRN changes to an inactive state (H level). As a result, the cell current Ic1 flows in the direction from the downside output signal line CBLD to the memory cell MC1 and the cell current Ic2 flows in the direction from the upside output signal line CBLU to the memory cell MC2. Since the subsequent read operation is the same as the case of FIG. 15, the explanation thereof is not repeated.

(Write Operation and Erase Operation)

The write operation and erase operation of the nonvolatile memory in Embodiment 2 are the same as the case of Embodiment 1. Therefore, the explanation thereof is not repeated.

(Effect)

As described above, in Embodiment 2, the source region of each memory cell of a specific column among each memory array which configures the memory mat 20 is not coupled to the source line. Accordingly, in the reference current reading system, the sub bit line SBL_UR or SBL_DR corresponding to the specific column is coupled to the output signal line CBLU or CBLD on the side of the reference current. According to the present configuration, unlike with Embodiment 1, the MOS transistor switches provided in the hierarchy sense amplifier band can be separated into switches for access to the upside memory array 22 and switches for access to the downside memory array 24. Therefore, it is possible to enhance the degree of freedom in design.

<Embodiment 3>

In Embodiment 1 and Embodiment 2, as illustrated in FIG. 6, the memory block 21 is configured with the hierarchy sense amplifier band 23 and the memory arrays 22 and 24 provided in the upper side and the down side of the hierarchy sense amplifier band 23, and the memory mat 20 is configured by arranging plural memory blocks 21 in the column direction. Each hierarchy sense amplifier band 23 is coupled to the sub bit lines SBL provided in the upside memory array 22 and the downside memory array 24.

In the semiconductor device according to Embodiment 3, in lieu of the hierarchy sense amplifier band 23 according to Embodiment 1 and Embodiment 2, one read sense amplifier band 28 is provided per the memory mat 20. The read sense amplifier band 28 is coupled to a write-system main bit line WMBL provided in common to the memory mat 20. In Embodiment 3, the write-system main bit line WMBL is employed in both data read and data write.

According to the above-described configuration, it is possible to reduce the number of the sense amplifier SA, resulting in the reduction of the circuit area of the flash memory module 6. Hereinafter, with reference to FIG. 23-FIG. 28, the detailed explanation thereof is made.

(Configuration of a Flash Memory Module)

Figure 23:
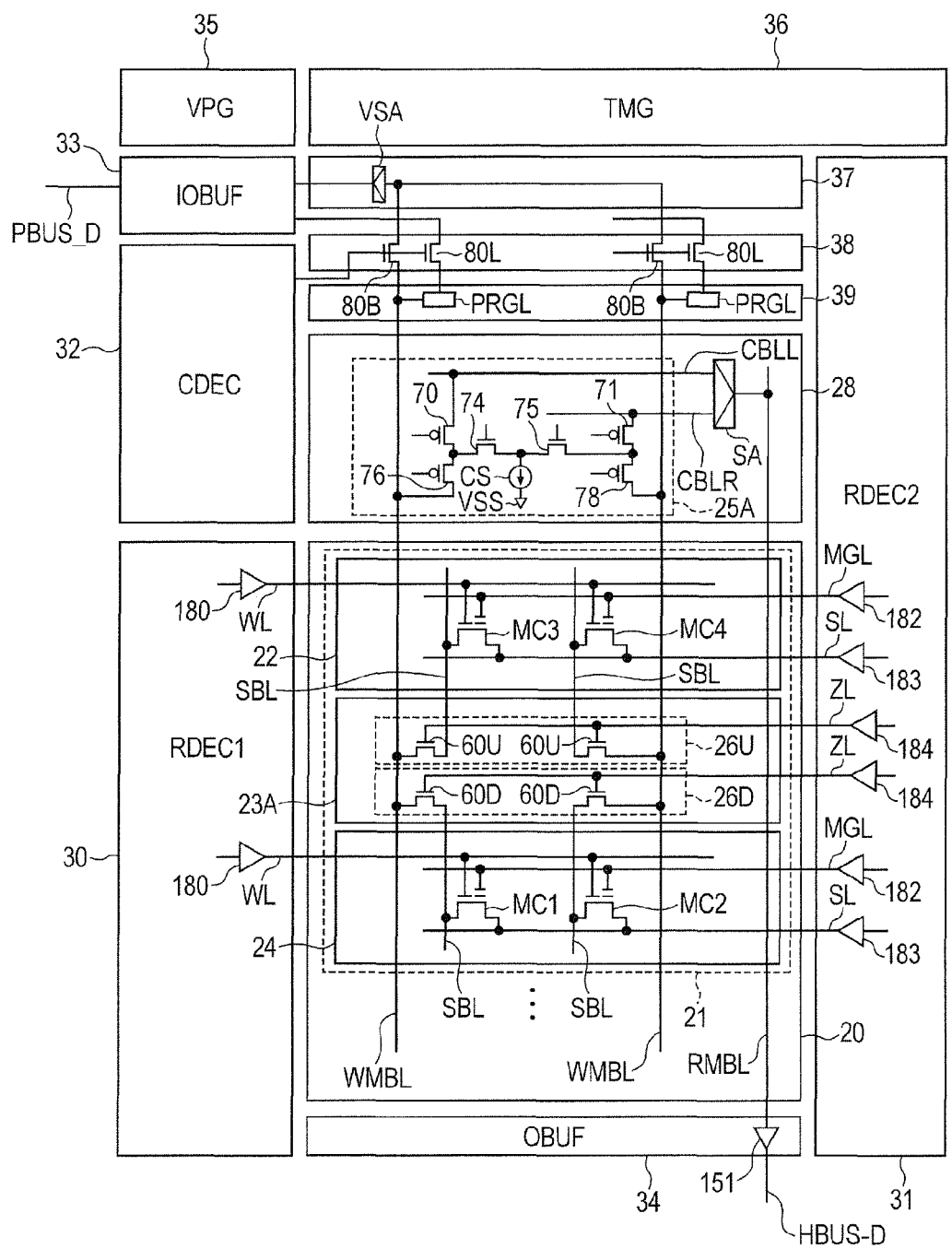
FIG. 23 is a block diagram illustrating the configuration of a flash memory module in a semiconductor device according to Embodiment 3.

FIG. 23 is a block diagram illustrating the configuration of a flash memory module in a semiconductor device according to Embodiment 3. The block diagram illustrated in FIG. 23 corresponds to the block diagram illustrated in FIG. 6 according to Embodiment 1.

With reference to FIG. 23, the flash memory module 6 includes a memory mat 20, a read sense amplifier band 28, an output buffer 34, a first row decoder 30, a second row decoder 31, a column decoder 32, an input/output buffer 33, a main-bit-line voltage control circuit 39, a rewriting column selector 38, a verification circuit 37, a power supply circuit 35, and a timing generator 36. What is different from the configuration of the flash memory module 6 illustrated in FIG. 6 is that the read sense amplifier band 28 is added and that the configuration of the memory mat 20 is correspondingly changed.

The memory mat 20 includes a column selection unit 23A and memory arrays 22 and 24 provided in both sides (in the column direction) of the column selection unit 23A, as one constituent unit (that is, the memory block 21). In the memory mat 20, plural pieces of such a block 21 are arranged in the column direction (FIG. 23 illustrates only one memory block 21 typically). The configuration of the memory arrays 22 and 24 has been explained with reference to FIG. 6, therefore the explanation thereof is not repeated.

The column selection unit 23A includes sub-bit-line selectors 26U and 26D. As explained in FIG. 6, the upside sub-bit-line selector 26U includes plural NMOS transistor switches 60U. By switching ON and OFF of these NMOS transistor switches 60U, the upside sub-bit-line selector 26U functions as a coupling switch unit which couples selectively the sub bit line SBL provided in the upside memory array 22 to the corresponding write-system main bit line WMBL. Similarly, the downside sub-bit-line selector 26D includes plural NMOS transistor switches 60D. By switching ON and OFF of these NMOS transistor switches 60D, the downside sub-bit-line selector 26D functions as a coupling switch unit which couples selectively the sub bit line SBL provided in the downside memory array 24 to the corresponding write-system main bit line WMBL.

The read sense amplifier band 28 includes a sense amplifier SA and a read column selector 25A. The sense amplifier SA includes a first and a second input node, and amplifies the difference between a current which flows through a first output signal line CBLL coupled to the first input node and a current which flows through a second output signal line CBLR coupled to the second input node, and thereby outputs the comparison result of both current values. The output signal of the sense-amplifier SA is transferred to the output buffer (OBUF) 34 via the read-system main bit line RMBL extending in the column direction. The detailed configuration of the sense amplifier SA is the same as described in Embodiment 1, therefore the explanation thereof is not repeated.

The read column selector 25A includes PMOS transistor switches 70, 71, 76, and 78. By switching these PMOS transistor switches, the read column selector 25A functions as a coupling switch unit which changes the coupling between each write-system main bit line WMBL and the output signal lines CBLL and CBLR described above. In the case of FIG. 23, the main bit line WMBL coupled to the memory cell MC1, which is employed as a positive cell in the complementary reading system, are coupled to the output signal line CBLL via the PMOS transistor switches 70 and 76. The main bit line WMBL coupled to the memory cell MC2, which is employed as a negative cell in the complementary reading system, are coupled to the output signal line CBLR via the PMOS transistor switches 71 and 78.

The read column selector 25A further includes a current source CS and NMOS transistor switches 74 and 75. In the reference current reading system, the current source CS is coupled to the output signal line CBLL or CBLR via the NMOS transistor switch 74 or 75, respectively.

The other points of FIG. 23 are the same as those illustrated in FIG. 6, therefore, the same symbol or reference numeral is attached to the same or corresponding element and the repeated explanation thereof is omitted. The entire configuration of the semiconductor device 1 is the same as what is explained in FIG. 1, the generating circuit of the control signal CMPLON is the same as what is explained in FIG. 10, and the configuration of the output buffer 34 is the same as what is explained in FIG. 12. Accordingly, the repeated explanation thereof is omitted.

The configuration of the sense amplifier SA is the same as what is explained in FIG. 11. However, the output signal lines CBLL and CBLR in Embodiment 3 correspond to the output signal lines CBLD and CBLU in FIG. 11, respectively.

(Details of the Read-System Circuit)

Figure 24:
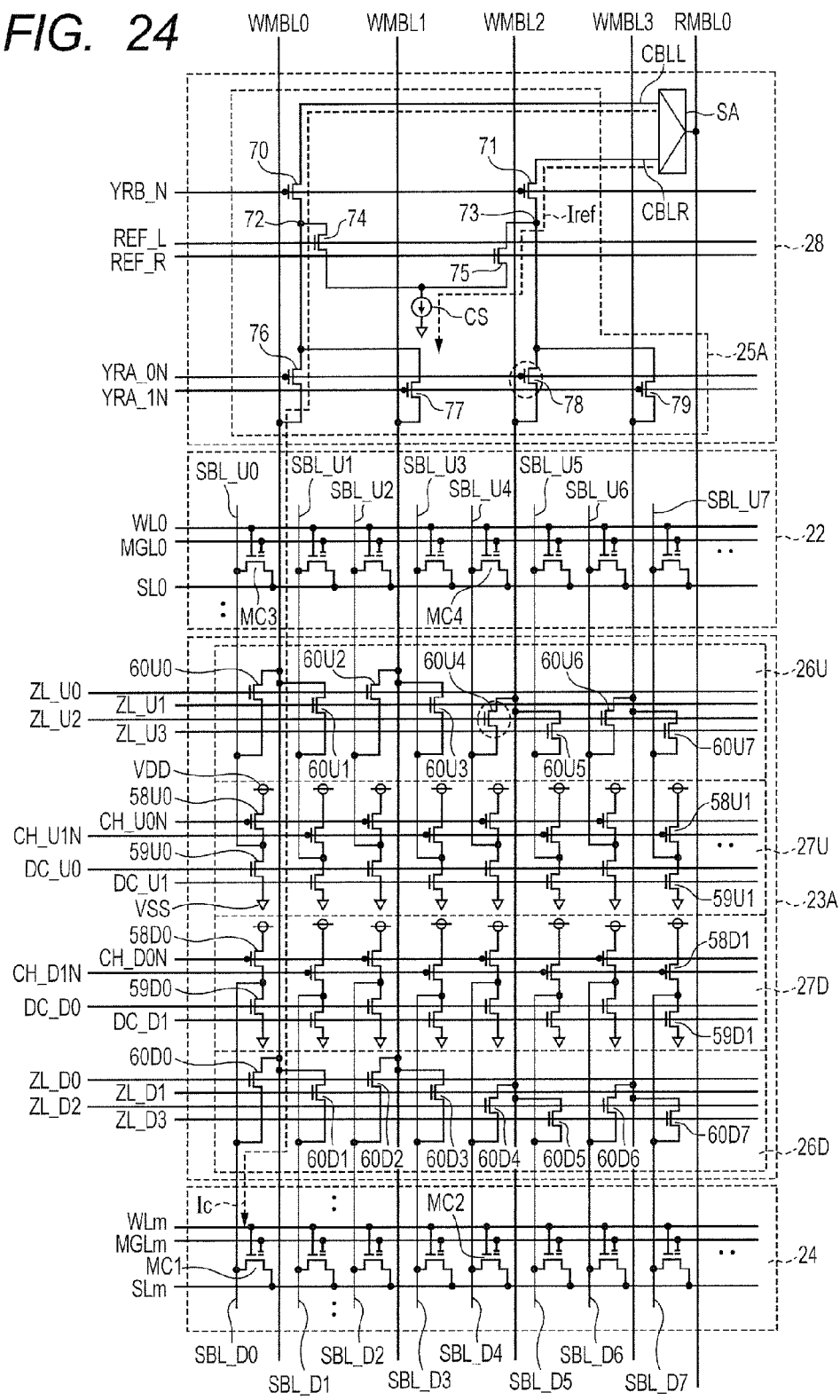
FIG. 24 is a drawing illustrating the detailed configuration of a column selection unit and a read sense amplifier band illustrated in FIG. 23.

FIG. 24 is a drawing illustrating the detailed configuration of the column selection unit and the read sense amplifier band illustrated in FIG. 23. FIG. 24 illustrates typically four write-system main bit lines WMBL0-WMBL3, eight sub bit lines SBL_U0-SBL_U7 corresponding to the upside memory array 22, eight sub bit lines SBL_D0-SBL_D7 corresponding to the downside memory array 24, and one read-system main bit line RMBL0. As is the case with FIG. 7, two sub bit lines SBL are assigned for every memory array to one write-system main bit line WMBL. Although not shown in FIG. 24, these bit lines are repeatedly provided in the row direction in the actual memory cell module 6.

FIG. 24 further illustrates the memory arrays 22 and 24 provided on both sides of the column selection unit 23A. The configuration of the memory arrays 22 and 24 has been explained with reference to FIG. 7; therefore, the explanation thereof is not repeated.

The column selection unit 23A includes charging and discharging circuits 27U and 27D, in addition to the sub-bit-line selectors 26U and 26D explained in FIG. 23. The configuration of the charging and discharging circuits 27U and 27D has been explained with reference to FIG. 7, therefore the explanation thereof is not repeated.

The sub-bit-line selector 26D includes NMOS transistor switches 60D0-60D7 respectively corresponding to the sub bit lines SBL_D0-SBL_D7, and the control signal lines ZL_D0-ZL_D3. The sub-bit-line selector 26D illustrated in FIG. 24 is different from the sub-bit-line selector 26D illustrated in FIG. 7 in that the control signal lines ZL_D2 and ZL_D3 are added.

In the sub-bit-line selector 26D, each of the NMOS transistor switches 60D0-60D7 is coupled between the corresponding sub bit line SBL and the write-system main bit line WMBL assigned to the corresponding sub bit line SBL. The control signal line ZL_D0 is coupled to the gates of the NMOS transistor switches 60D0 and 60D2, and the control signal line ZL_D1 is coupled to the gates of the NMOS transistor switches 60D1 and 60D3. Similarly, the control signal line ZL_D2 is coupled to the gates of the NMOS transistor switches 60D4 and 60D6, and the control signal line ZL_D3 is coupled to the gates of the NMOS transistor switches 60D5 and 60D7.

The configuration of the sub-bit-line selector 26U corresponds to the configuration of the above-described sub-bit-line selector 26D in which the subscript D is replaced with the subscript U; therefore, the explanation thereof is not repeated. For example, the sub bit lines SBL_D0-SBL_D7 provided in the downside memory array 24 are replaced with the sub bit lines SBL_U0-SBL_U7 provided in the upside memory array 22, respectively.

As explained in FIG. 23, the read sense amplifier band 28 includes a sense amplifier SA and a read column selector 25A. The read column selector 25A includes PMOS transistor switches 70, 71, and 76-79, NMOS transistor switches 74 and 75, a current source CS, and control signal lines YRA_0N, YRA_1N, YRB_N, REF_L, and REF_R. The current source CS is configured with an NMOS transistor of which the gate is supplied with a constant voltage, for example.

The PMOS transistor switches 76-79 correspond to the write-system main bit lines WMBL0-WMBL4, respectively. Each of the PMOS transistor switches 76 and 77 is coupled between the corresponding write-system main bit line and the common node 72. Each of the PMOS transistor switches 78 and 79 is coupled between the corresponding write-system main bit line and the common node 73. The PMOS transistor switch 70 is coupled between the common node 72 and the output signal line CBLL. The PMOS transistor switch 71 is coupled between the common node 73 and the output signal line CBLR. The NMOS transistor switch 74 is coupled between the common node 72 and the current source CS. The NMOS transistor switch 75 is coupled between the common node 73 and the current source CS.

The control signal line YRA_0N is coupled to the gates of the PMOS transistor switches 76 and 78. The control signal line YRA_1N is coupled to the gates of the PMOS transistor switches 77 and 79. The control signal line YRB_N is coupled to the gates of the PMOS transistor switches 70 and 71. The control signal lines REF_L and REF_R are coupled to the gates of the NMOS transistor switches 74 and 75, respectively.

(On the Path of a Memory Cell Current and a Reference Current in the Reference Current Reading System)

With reference to FIG. 24, the following explains on the path of a cell current Ic in reading the data of the memory cell MC1 and the path of a reference current Iref.

When reading the data of the memory cell MC1, a word line WLm coupled to the control gate of memory cell MC1 is activated to an H level. Furthermore, a cell current Ic is generated by activating the control signal lines YRA_0N, YRB_N, and ZL_D0. The cell current Ic flows in the direction from the sense amplifier SA to the source line SL, via the output signal line CBLL, the PMOS transistor switches 70 and 76, the write-system main bit line WMBL0, the NMOS transistor switch 60D0, and the memory cell MC1. At the time of data read, the source line SL is coupled to the ground node VSS.

In order to generate the reference current Iref, the control signal line REF_R is activated further. The reference current Iref flows in the direction from the sense amplifier SA to the ground node VSS, via the output signal line CBLR, the PMOS transistor switches 71, the NMOS transistor switch 75, and the current source CS. The magnitude of the reference current Iref is adjusted by the current source CS.

When generating the reference current Iref, the PMOS transistor switch 60U4 is further set to ON by activating the control signal line ZL_U2. Accordingly, the wiring capacitance of the sub bit line SBL_U4 is added to the output signal line CBLR on the side of the current source CS. The wiring capacitance of the sub bit line SBL_U4 has the almost same value as the wiring capacitance of the sub bit line SBL_D0 coupled to the memory cell MC1. Accordingly, it is possible to make the load of the first input node and the load of the second input node almost equal, in the sense amplifier SA. Therefore, it is possible to make an exact comparison of the cell current Ic and the reference current Iref (that is, exact detection of the data of the memory cell MC1).

The sense amplifier SA amplifies the difference between the cell current Ic and the reference current Iref. The output signal of the sense amplifier SA is transferred to the output buffer OBUF via the read-system main bit line RMBL0.

(On the Path of a Memory Cell Current in the Complementary Reading System)

Figure 25:
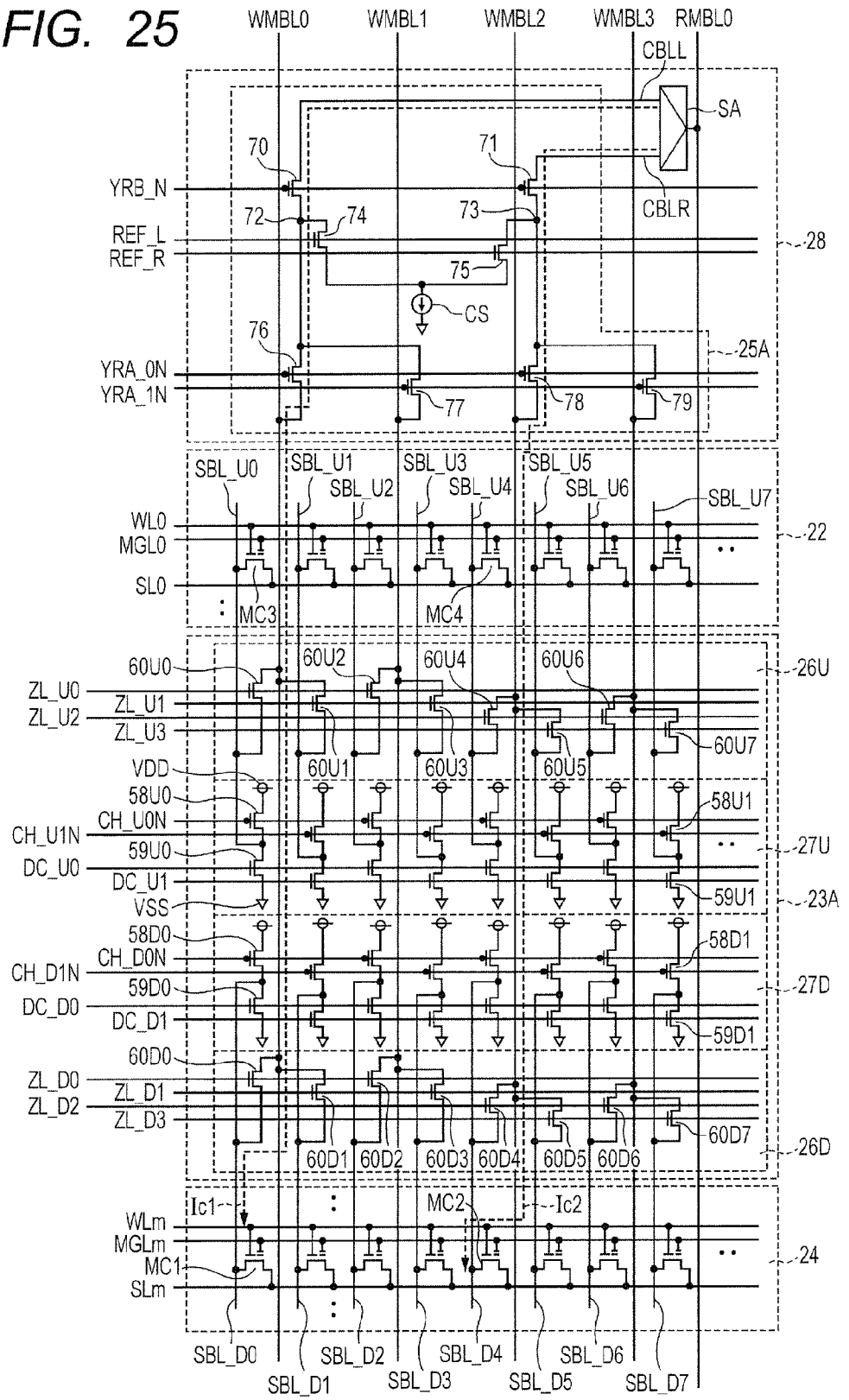
FIG. 25 is a drawing illustrating a path of a memory cell current in the complementary reading system in the circuit configuration of FIG. 24.

FIG. 25 is a drawing illustrating a path of a memory cell current in the complementary reading system in the circuit configuration illustrated in FIG. 24. When reading the data of the memory cells MC1 and MC2 configuring a twin cell, the path of a cell current Ic1 flowing through the memory cell MC1 and the path of a cell current Ic2 flowing through the memory cell MC2 are illustrated in FIG. 25.

When reading the data of the memory cells MC1 and MC2, the word line WLm coupled common to the memory cells MC1 and MC2 is activated. In this state, the control signal lines YRA_0N, YRB_N, ZL_D0, and ZL_D2 are activated to generate the cell currents Ic1 and Ic2. The cell current Ic1 flows in the direction from the sense amplifier SA to the source line SL, via the output signal line CBLL, the PMOS transistor switches 70 and 76, the write-system main bit line WMBL0, the NMOS transistor switch 60D0, and the memory cell MC1. The cell current Ic2 flows in the direction from the sense amplifier SA to the source line SL, via the output signal line CBLR, the PMOS transistor switches 71 and 78, the write-system main bit line WMBL2, the NMOS transistor switch 60D4, and the memory cell MC2. At the time of data read, the source line SL is coupled to the ground node VSS.

The sense-amplifier SA amplifies the difference between the cell current Ic1 and the cell current Ic2. The output signal of the sense amplifier SA is transferred to the output buffer OBUF via the read-system main bit line RMBL0. In the complementary reading system, the control signal lines REF_L and REF_R are always in an inactive state (L level).

(Drive of Control Signals Used by the Read Column Selector and the Column Selection Unit)

Figure 26A:
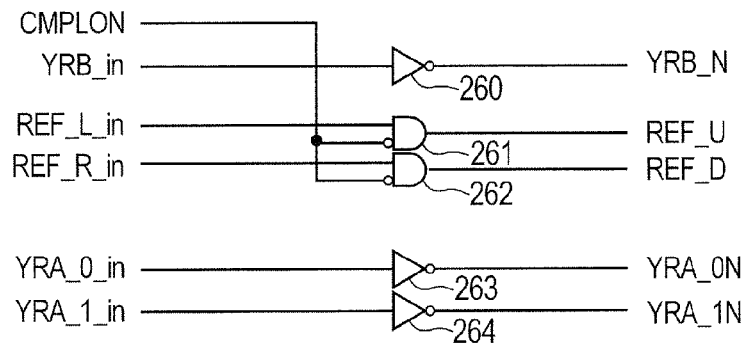
FIGS. 26A and 26B are drawings illustrating the configuration of a driver circuit for driving each control signal line in the read sense amplifier band and the column selection unit illustrated in FIG. 24.
Figure 26B:
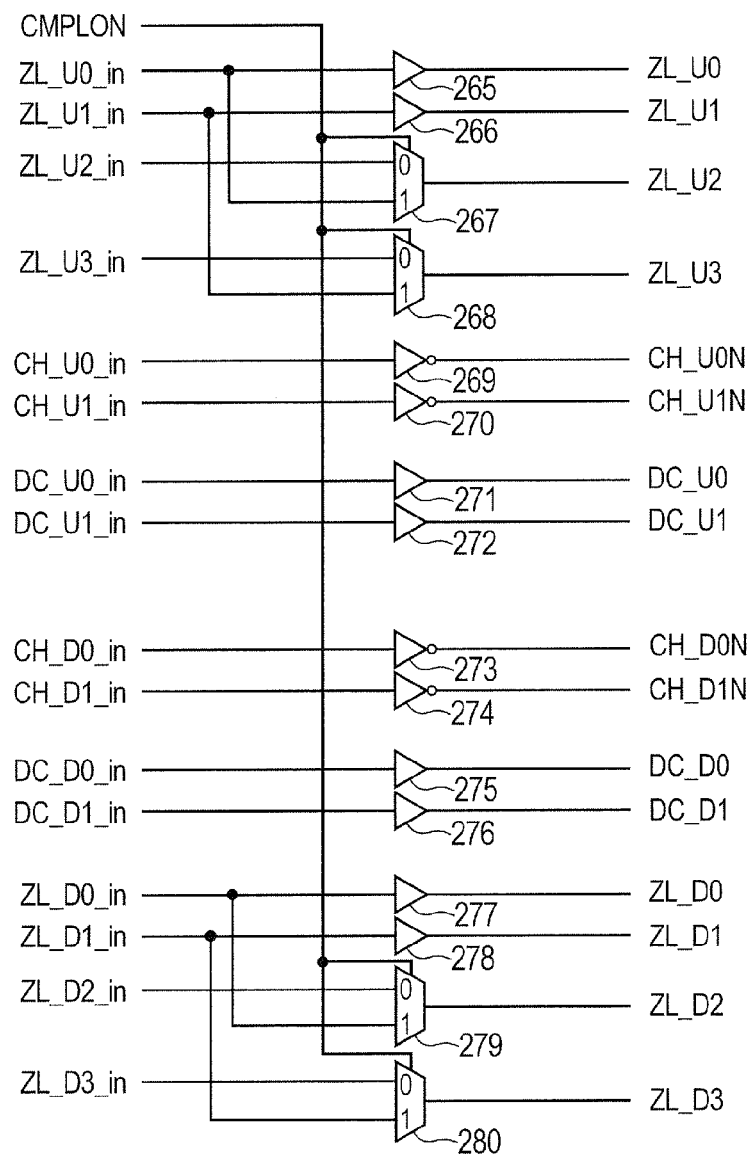

FIGS. 26A and 26B are drawings illustrating the configuration of a driver circuit for driving each control signal line in the read sense amplifier band and the column selection unit illustrated in FIG. 24. FIG. 26A illustrates the configuration of the driver circuit for the control signal lines provided in the read sense amplifier band 28 illustrated in FIG. 24. FIG. 26B illustrates the configuration of the driver circuit for the control signal lines provided in the column selection unit 23A illustrated in FIG. 24.

Among the input signals of FIG. 26A and FIG. 26B, a control signal CMPLON is a signal for distinguishing between the complementary reading system and the reference current reading system to be applied to the memory cell of a read target and a write target, and is supplied from the flash sequencer (FSQC) 7 illustrated in FIG. 1. Other input signals are generated by the column decoder (CDEC) 32 based on a control signal from the flash sequencer (FSQC) 7, a control signal from the timing generator 36 illustrated in FIG. 6, and an address supplied to the input/output buffer (IOBUF) 33.

With reference to FIG. 26A, the signals supplied to the control signal lines YRB_N, YRA_U0N, and YRA_U1N are generated respectively by inverting the control signals YRB_in, YRA_U0_in, and YRA_U1_in by the inverters 260, 263, and 264.

Signals supplied to the control signal lines REF_U and REF_D are generated by the logic gates 261 and 262, respectively. When the CMPLON="0" (the reference current reading system), the logic gate 261 outputs a signal obtained by amplifying the control signal REF_L in to a control signal line REF_L. When the CMPLON="1" (the complementary reading system), the logic gate 261 outputs a signal of an L level ("0") irrespective of the control signal REF_L in, to deactivate the control signal line REF_L. Similarly, when the CMPLON="0" (the reference current reading system), the logic gate 262 outputs a signal obtained by amplifying the control signal REF_R_in to the control signal line REF_R. When the CMPLON="1" (the complementary reading system), the logic gate 262 outputs a signal of an L level ("0") irrespective of the control signal REF_R_in, to deactivate the control signal line REF_R.

With reference to FIG. 26B, signals supplied to control signal lines ZL_U0, ZL_U1, ZL_D0, and ZL_D1 are generated by amplifying the control signals ZL_U0_in, ZL_U1_in, ZL_D0_in, and ZL_D1_in by the buffers 265, 266, 277, and 278, respectively. Signals supplied to control signal lines DC_U0, DC_U1, DC_D0, and DC_D1 are generated by amplifying the control signals DC_U0_in, DC_U1_in, DC_D0_in, and DC_D1_in by the buffers 271, 272, 275, and 276, respectively.

Signals supplied to control signal lines CH_U0N, CH_U1N, CH_D0N, and CH_D1N are generated by inverting and amplifying control signals CH_U0_in, CH_U1_in, CH_D0_in, and CH_D1_in by the inverters 269, 270, 273, and 274, respectively.

Signals selected by the selectors 267, 268, 279, and 280 are supplied to control signal lines ZL_U2, ZL_U3, ZL_D2, and ZL_D3, respectively. Specifically, the selector 267 outputs the control signal ZL_U2_in to the control signal line ZL_U2, when the CMPLON="0" (the reference current reading system), and outputs the control signal ZL_U0_in to the control signal line ZL_U2 when the CMPLON="1" (the complementary reading system). Accordingly, in the complementary reading system, the sub bit line SBL_U0 or SBL_U2 to which the positive cell is coupled, and the sub bit line SBL_U4 or SBL_U6 to which the corresponding negative cell is coupled can be accessed without fail.

Similarly, the selector 268 outputs the control signal ZL_U3_in to the control signal line ZL_U3 when the CMPLON="0" (the reference current reading system), and outputs the control signal ZL_U1_in to the control signal line ZL_U3 when the CMPLON="1" (the complementary reading system). The selector 279 outputs the control signal ZL_D2_in to the control signal line ZL_D2 when the CMPLON="0" (the reference current reading system), and outputs the control signal ZL_D0_in to the control signal line ZL_D2 when the CMPLON="1" (the complementary reading system). The selector 280 outputs the control signal ZL_D3_in to the control signal line ZL_D3 when the CMPLON="0" (the reference current reading system), and outputs the control signal ZL_D1_in to the control signal line ZL_D3 when the CMPLON="1" (the complementary reading system).

(Read Operation in the Reference Current Reading System)

Figure 27:
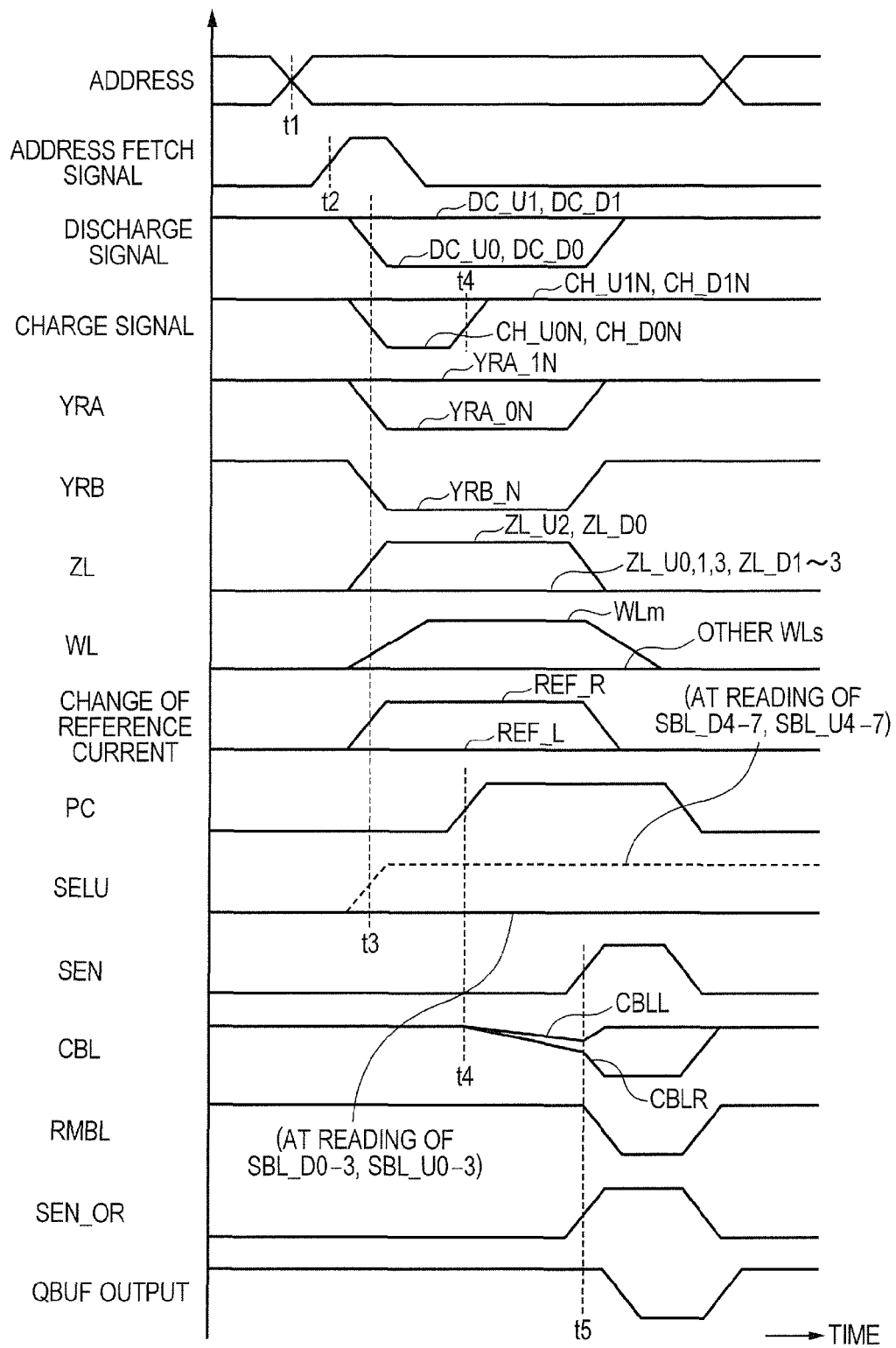
FIG. 27 is a timing chart illustrating an example of read operation in the reference current reading system according to Embodiment 3.

FIG. 27 is a timing chart illustrating an example of read operation in the reference current reading system according to Embodiment 3. With reference mainly to FIG. 23, FIG. 24, and FIG. 27, the following explains the procedure of the data read of the memory cell MC1 provided in the memory array 24, in the reference current reading system. In the following explanation, it is assumed that data "0" (a state of a high threshold voltage) is written in the memory cell MC1.

First, at time t1 of FIG. 27, the address information is switched. At time t2, the flash sequencer (FSQC) 7 illustrated in FIG. 1 outputs an address fetch signal. In response to this signal, the input/output buffer (IOBUF) fetches address information. The fetched address information is decoded by the column decoder 32 and the row decoders 30 and 31.

At time t3, the driver provided in the row decoders 30 and 31 and the column decoder 32 activates a control signal line necessary for the data read of the memory cell MC1 based on the address signal. Specifically, it is as follows.

(i) The discharge signal supplied to the control signal lines DC_U0 and DC_D0 is switched to an inactive state (L level), and the control signal lines DC_U1 and DC_D1 are maintained in an active state (H level). On the other hand, the charge signal supplied to the control signal lines CH_U0N and CH_D0N is switched to an active state (L level), and the control signal lines CH_U1N and CH_D1N are maintained in an inactive state (H level). Accordingly, at least the sub bit line SBL_D0 to which the memory cell MC1 as the read target is coupled, and the sub bit line SBL_U4 of the upside memory array 22 are precharged to the power supply potential, and the adjoining sub bit lines SBL_D1, SBL_U3, and SBL_U5 are maintained at the ground potential.

(ii) The control signal lines YRA_0N and YRB_N are switched to an active state (L level), and the control signal lines ZL_U2 and ZL_D0 are switched to an active state (H level). Accordingly, the sub bit line SBL_D0 to which the memory cell MC1 is coupled is electrically coupled to the output signal line CBLL via the write-system main bit line WMBL0, and the sub bit line SBL_U4 is electrically coupled to the output signal line CBLR via the write-system main bit line WMBL2.

(iii) By setting the control signal line REF_R_in an active state (H level), the current source CS is electrically coupled to the output signal line CBLR.

(iv) The word line WLm coupled to the memory cell MC1 as the read target is switched to an active state (H level).

(v) When reading the data of the memory cell coupled to the sub bit lines SBL_D0-SBL_D3 or SBL_U0-SBL_U3, the selection signal SELU supplied to the selector 148 of the sense amplifier SA (refer to FIG. 11) is set at an L level ("0").

At the next time t4, the precharge signal PC supplied to the sense amplifier SA by the flash sequencer (FSQC) 7 changes to an inactive state (H level), and the charge signal supplied from the driver of the row decoders 30 and 31 to the control signal lines CH_U0N and CH_D0N changes to an inactive state (H level). As a result, the cell current Ic flows in the direction from the output signal line CBLL to the memory cell MC1 and the reference current Iref flows in the direction from the output signal line CBLR to the current source CS. Since data "0" (a state of a high threshold voltage) is written in the memory cell MC1, the cell current Ic is smaller than the reference current Iref. Therefore, the potential of the output signal line CBLR becomes lower than the potential of the output signal line CBLL.

At the next time t5, the flash sequencer (FSQC) 7 changes the sense enable signal SEN outputted to the sense amplifier SA to an active state (H level). Accordingly, the NMOS transistor 147 illustrated in FIG. 11 is set to ON, and the latch circuit 136 begins to operate. The latch circuit 136 amplifies the potential difference between the output signal lines CBLL and CBLR. As a result, the potential of the output signal line CBLR falls to the ground potential (VSS), and the potential of the output signal line CBLL rises to the power supply potential (VDD). The potential of the output signal line CBLR is outputted to the read-system main bit line RMBL via the selector 148 and the three-state buffer.

Furthermore, at time t5, the sense enable signal SEN is activated, and the control signal SEN_OR outputted to the output data buffer (OBUF) 34 also changes to an active state (H level). Accordingly, the voltage signal outputted from the sense amplifier SA to the read-system main bit line RMBL is transmitted to the output data buffer (OBUF) 34 via the read-system main bit line RMBL, and is outputted from the output data buffer 34 to the corresponding data bus of the high speed bus (HBUS).

(Read Operation in the Complementary Reading System)

Figure 28:
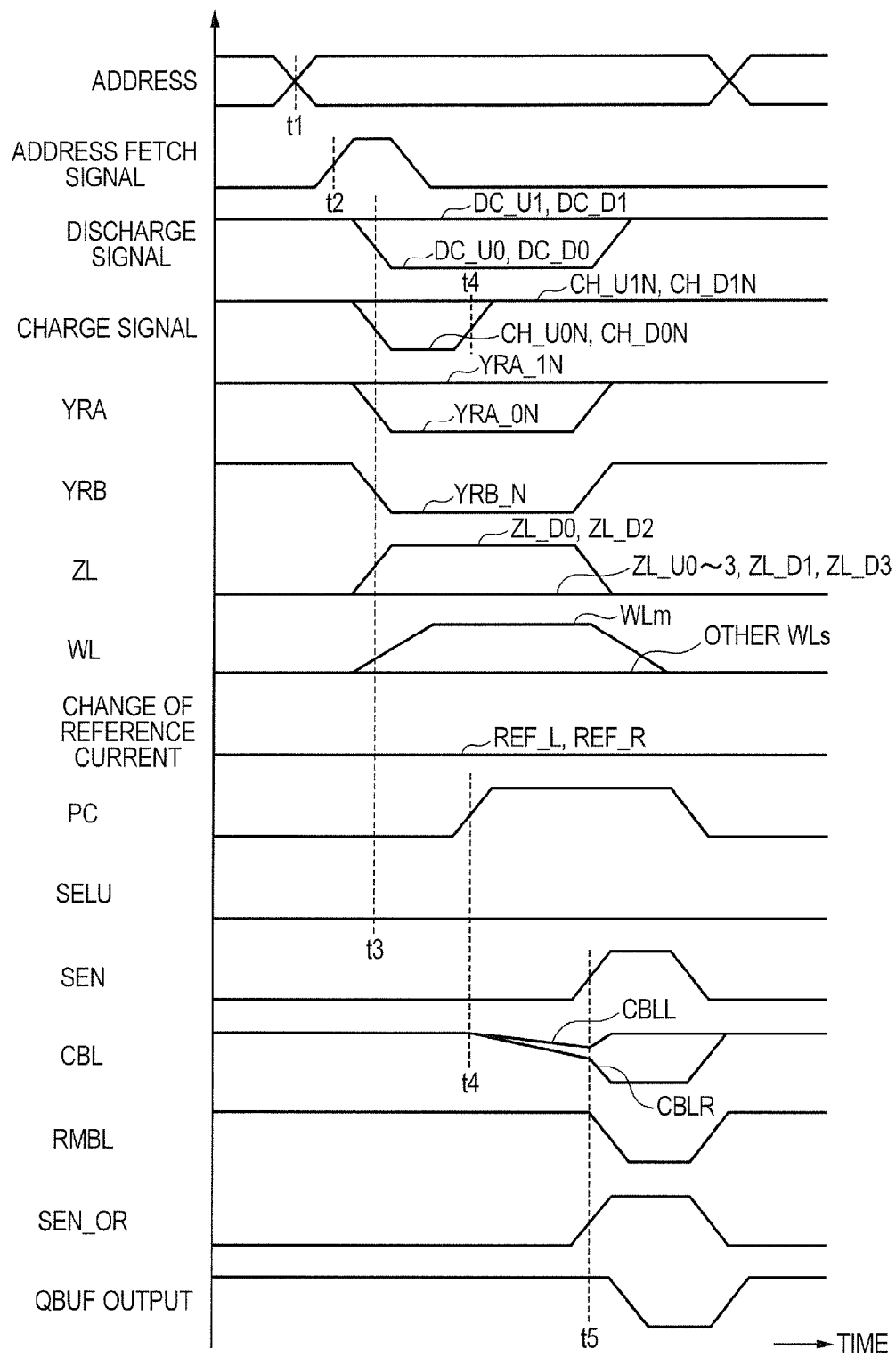
FIG. 28 is a timing chart illustrating an example of read operation in the complementary reading system according to Embodiment 3.

FIG. 28 is a timing chart illustrating an example of read operation in the complementary reading system according to Embodiment 3. With reference mainly to FIG. 23, FIG. 25, and FIG. 28, the following explains the procedure of reading the data of the twin cell configured with the memory cells MC1 and MC2 provided in the memory array 24, in the complementary reading system. In the following explanation, it is assumed that data "0" (a state of a high threshold voltage) is written in the memory cell MC1 and that data "1" (a state of a low threshold voltage) is written in the memory cell MC2.

As is the case with FIG. 27, first, at time t1 of FIG. 28, the read address is switched, and at time t2, the address fetch signal is outputted from the flash sequencer (FSQC) 7.

At time t3, the driver provided in the row decoders 30 and 31 activates a control signal line necessary for the data read of the memory cells MC1 and MC2 based on the address signal. Specifically, it is as follows.

(i) The discharge signal supplied to the control signal lines DC_U0 and DC_D0 is switched to an inactive state (L level), and the control signal lines DC_U1 and DC_D1 are maintained in an active state (H level). On the other hand, the charge signal supplied to the control signal lines CH_U0N and CH_D0N is switched to an active state (L level), and the control signal lines CH_U1N and CH_D1N are maintained in an inactive state (H level). Accordingly, at least the sub bit line SBL_D0 and SBL_D4 to which the memory cells MC1 and MC2 as the read target are coupled and the sub bit lines SBL_U0 and SBL_U4 of the same column of the upside memory array 22 are precharged to the power supply potential, and the adjoining sub bit lines SBL_D1, SBL_U1, SBL_D3, SBL_U3, SBL_D5, and SBL_U5 are maintained at the ground potential.

(ii) The control signal lines YRA_0N and YRB_N are switched to an active state (L level), and the control signal lines ZL_D0 and ZL_D2 are switched to an active state (H level). Accordingly, the sub bit lines SBL_D0 and SBL_D4 which are coupled to the memory cells MC1 and MC2 respectively, are electrically coupled to the output signal lines CBLL and CBLR, respectively.

(iii) The control signal lines REF_U and REF_D are maintained in an inactive state (L level); accordingly, the current source CS is not electrically coupled to the output signal lines CBLL and CBLR.

(iv) The word line WLm coupled common to the memory cell MC1 and MC2 as the read target is switched to an active state (H level).

(v) In the complementary reading system, the selection signal SELU supplied to the selector 148 of the sense amplifier SA (refer to FIG. 11) is set at an L level ("0").

At the next time t4, the precharge signal PC supplied to the sense amplifier SA by the flash sequencer (FSQC) 7 changes to an inactive state (H level), and the charge signal supplied from the driver of the row decoders 30 and 31 to the control signal lines CH_U0N and CH_D0N changes to an inactive state (H level). As a result, the cell current Ic1 flows in the direction from output signal line CBLL to the memory cell MC1, and the cell current Ic2 flows in the direction from the output signal line CBLR to the memory cell MC2. Since data "0" (a state of a high threshold voltage) is written in the memory cell MC1 and data "1" (a state of a low threshold voltage) is written in the memory cell MC2, the cell current Ic1 is smaller than the cell current Ic2. Therefore, the potential of the upside output signal line CBLR becomes lower than the potential of the downside output signal line CBLL.

At the next time t5, the flash sequencer (FSQC) 7 changes the sense enable signal outputted to the sense amplifier SA to an active state (H level). The subsequent operations are the same as that of the reference current reading system; accordingly the repeated explanation thereof is omitted.

(Write Operation and Erase Operation)

The write operation and erase operation of the nonvolatile memory in Embodiment 3 are the same as the case of Embodiment 1. Therefore, the explanation thereof is not repeated.

(Effect)

As described above, in Embodiment 3, one read sense amplifier band 28 is provided to the memory mat 20, in lieu of the hierarchy sense amplifier band 23 according to Embodiment 1 and Embodiment 2. The read sense amplifier band 28 is coupled to the write-system main bit line WMBL provided in common in the memory mat 20. The sub bit line SBL of each memory array is coupled to the corresponding write-system main bit line WMBL via the sub bit-line selectors 26U and 26D. According to this configuration, it is possible to reduce the number of the sense amplifier SA, resulting in the reduction of the circuit area of the flash memory module 6.

<A Modified Example>

The nonvolatile memory may store the same data in plural rows of the same column of the memory array at the time of data write. In this case, the word line corresponding to the plural rows in which the same data has been stored is activated simultaneously at the time of data read. Accordingly, it is possible to perform the data read even when there is a little current flowing through each memory cell, leading to an enhanced read margin.

As described above, the invention accomplished by the present inventors has been concretely explained based on the embodiments. However, it is needless to say that the present invention is not restricted to the embodiments as described above, and it can be changed variously in the range which does not deviate from the gist.

What is claimed is:

1. A semiconductor device comprising:
   a first memory array including a plurality of memory cells arranged in a matrix, a plurality of bit lines respectively corresponding to columns of the memory cells, and a plurality of word lines respectively corresponding to rows of the memory cells;
   a sense amplifier configured to amplify the difference of currents flowing through a first and a second output signal lines;

a coupling switch unit configured to switch coupling between the first and second output signal lines and the bit lines of the first memory array based on specified modes including first and second modes, the first mode performing data read by comparing a current flowing through a memory cell as a read target and the second mode performing data read by comparing currents flowing through first and second memory cells as a read target storing complementary data; and a second memory array including a plurality of memory cells arranged in a matrix, a plurality of bit lines respectively corresponding to columns of the memory cells, and a plurality of word lines respectively corresponding to rows of the memory cells, wherein, in the first mode, the coupling switch unit couples a bit line of the first memory array corresponding to the memory cell as the read target to the first output signal line and couples a reference current source to the second output signal line, wherein, in the second mode, the coupling switch unit couples the first and second bit lines of the first memory array corresponding to the first and second memory cells as the read target to the first and second output signal lines respectively, wherein the coupling switch unit further switches coupling between the first and the second output signal line and the bit lines of the second memory array, and wherein, when data of a memory cell included in the first memory array is read in the first mode, the coupling switch unit couples a bit line of the first memory array corresponding to the memory cell as the read target to the first output signal line, and couples any one of the bit lines of the second memory array and the reference current source to the second output signal line.

2. The semiconductor device according to claim 1, wherein each of the memory cells comprises:
a first main electrode;
a second main electrode; and
a control electrode,
wherein the control electrode is coupled to the corresponding word line,
wherein the first main electrode is coupled to the corresponding bit line,
wherein the second main electrode is coupled to a reference potential node except for a memory cell of a specific column which is not employed for data storage, and the second main electrode of each memory cell of the specific column of the first memory array is not coupled to the reference potential node.

3. The semiconductor device according to claim 1, wherein semiconductor device further comprises:
a plurality of main bit lines provided for every columns of the first memory array and for every columns of the second memory array, and shared by the first and the second memory array,
wherein the coupling switch unit comprises:
a first switch unit operable to switch coupling between each of the main bit lines and the bit line of the corresponding columns of the first memory array;

a second switch unit operable to switch coupling between each of the main bit lines and the bit line of the corresponding columns of the second memory array; and a third switch unit operable to switch coupling between the main bit lines and the first and the second output signal line, wherein complementary data read in second mode are stored in the first and the second memory cell corresponding to different main bit lines, respectively, wherein, when data of a memory cell included in the first memory array is read in the first mode, the first switch unit couples the bit line of the first memory array corresponding to the memory cell as the read target to the corresponding first main bit line, the second switch unit couples one of the corresponding bit lines of the second memory array to the second main bit line different from the first main bit line, and the third switch unit couples the first main bit line to the first output signal line and couples the second main bit line and the reference current source to the second output signal line, and wherein, when complementary data of the first and the second memory cell included in the first memory array are read in the second mode, the first switch unit couples the bit line of the first memory array corresponding to the first memory cell to the corresponding first main bit line and couples the bit line of the first memory array corresponding to the second memory cell to the corresponding second main bit line, and the third switch unit couples the first and the second main bit line to the first and the second output signal line, respectively.

4. The semiconductor device according to claim 1, wherein, at the time of data write, the nonvolatile memory stores identical data at a plurality of rows of an identical column of the first memory array, and at the time of data read, the nonvolatile memory activates simultaneously the word lines corresponding to the rows in which the identical data have been stored.

5. The semiconductor device according to claim 1, wherein the nonvolatile memory further comprises:
a controller configured to create a control signal to specify which of the complementary reading system and the reference current reading system is employed for the data read, depending on whether a read address received from an exterior agrees with address information indicating a complementary data storing area, stored in advance, and
wherein the coupling switch unit switches the coupling between the each bit line and the first and the second output signal line, based on the read address and the control signal.

6. The semiconductor device according to claim 1, wherein the semiconductor device performs as a reference current reading system in the first mode, and performs as a complementary reading system in the second mode.

* * * * *